(12) United States Patent
Tanaka et al.

(10) Patent No.: US 6,519,184 B2
(45) Date of Patent: Feb. 11, 2003

(54) NON-VOLATILE MEMORY DEVICE WITH PLURALITY OF THRESHOLD VOLTAGE DISTRIBUTIONS

(75) Inventors: Toshihiro Tanaka, Akiruno (JP); Hiroyuki Tanikawa, Kodaira (JP); Masayoshi Nakano, Kokubunji (JP); Norio Oza, Fussa (JP); Koki Watanabe, Yame (JP); Yutaka Shinagawa, Iruma (JP)

(73) Assignees: Hitachi, Ltd., Tokyo (JP); Hitachi ULSI Systems Co., Ltd., Tokyo (JP)

( * ) Notice: Subject to any disclaimer, the term of this patent is extended or adjusted under 35 U.S.C. 154(b) by 0 days.

(21) Appl. No.: 10/082,335

(22) Filed: Feb. 26, 2002

(65) Prior Publication Data

US 2002/0154545 A1 Oct. 24, 2002

(30) Foreign Application Priority Data

Apr. 19, 2001 (JP) ........................................ 2001-120794

(51) Int. Cl.[7] .............................................. G11C 16/06
(52) U.S. Cl. ............................. 365/185.22; 365/185.24; 365/185.18
(58) Field of Search ..................... 365/185.22, 185.24, 365/185.18, 185.33, 185.29

(56) References Cited

U.S. PATENT DOCUMENTS 5,856,944 A * 1/1999 Prickett et al. ......... 365/185.22

FOREIGN PATENT DOCUMENTS

JP 2000-90675 3/2000

\* cited by examiner

Primary Examiner—David Lam
(74) Attorney, Agent, or Firm—Miles & Stockbridge P.C.

(57) ABSTRACT

In a verify operation after a write or erase to check whether a memory cell threshold voltage is contained in a predetermined threshold voltage distribution, verify voltage is changed in three stages or more in a direction to mitigate the decision condition. This prevents non-convergence of write and erase operation and can complete the write or erase in a short time.

19 Claims, 21 Drawing Sheets

NON-VOLATILE MEMORY DEVICE WITH PLURALITY OF THRESHOLD VOLTAGE DISTRIBUTIONS

BACKGROUND OF THE INVENTION

The present invention relates to a technique which can advantageously be used for a verify method after write or erase and write or erase pulse application method in a non-volatile semiconductor memory electrically writable and erasable. For example, the present invention can effectively be used in a flash memory chip in which data can be erased on block basis at once and a microcomputer having such a flash memory built in.

A flash memory uses as a memory cell a non-volatile storage element including MOSFET of two-layered gate structure having a control gate and a floating gate. In such a flash memory, voltage is applied between a control gate and a substrate (or a well region) or between a control gate and a source or drain and electric charge is injected into or released into the floating gate, so as to change a threshold voltage, thereby storing data.

It should be noted that there are two types of flash memories: one in which the threshold voltage is increased for data write and decreased for data erase; and one in which the threshold voltage is decreased for write and increased for erase. In any of these, normally, write is performed in a word line unit (also called a sector unit) or the word line is divided into one to several hundreds of bytes for performing write while erase is performed on block base, i.e., a plurality of sectors sharing a well region and a source line are erased simultaneously.

We have examined details of the technique for reducing the time required for write a flash memory which employs the write method using hot electrons. Conventionally, when write or erase operation is performed in a flash memory, voltage is applied for write or erase and a verify read operation is performed to decide whether the memory threshold voltage has changed to a desired level. If the threshold voltage change is insufficient, again voltage is applied for write or erase. Control is performed by repeating the aforementioned operation, so that the threshold voltage distribution is not greater than the desired voltage or not smaller than the desired voltage.

However, while repeating the verify operation, memory cells in the vicinity of the threshold voltage allowance level may result in different decisions due to a noise coming into a sense amplifier and a slight difference of the operation condition. Moreover, there is also a case that electric charge is not completely injected into the floating gate and unstable charge trapped on the boundary of an insulation film causes decision that the threshold voltage has reached the desired level and after this, the verify operation is repeated while the charge on the insulation film boundary disappears, thereby changing the threshold voltage. For this, a memory cell which has once determined to be write complete or erase complete may be decided to be write complete or erase incomplete at the next verify operation. This results in increase of the total number of write and erase operations and the time required for write and erase, which may prevent convergence, i.e., the operation may not be terminated.

To solve the aforementioned problem, JP-A-2000-90675 laid-open on Mar. 31, 2000 proposes an invention that read is performed with a voltage of the verify condition mitigated (loosened) according to the number of times of application of write voltage to one and the same storage element. This prior art discloses an embodiment in which two stages of verify voltage are prepared and the two voltage levels are alternately used for performing the verify read and another embodiment in which at the last n-th time (fifth time for example), a voltage level with a mitigated condition is used for performing the verify read.

However, after further examination in details, we have found that there is a case that write operation or erase operation cannot be quickly converted only by switching the aforementioned two stages of verify voltage level. Moreover, even when a verify operation is performed with a mitigated voltage level, rewrite or re-erase may be performed, causing a phenomenon that the memory threshold voltage exceeds the allowable voltage level of the opposite side (hereinafter, referred to as Vth thrust).

Here, detailed explanation will be given on the aforementioned Vth thrust phenomenon with reference to FIG. 24. In FIG. 24, it is assumed that data "0" corresponds to a high threshold voltage of the memory cell and data "1" corresponds to a low threshold voltage of the memory cell; and the operation causing the memory cell to be in a high threshold voltage state is referred to as write while the operation causing the memory cell to be in a low threshold voltage state is referred to as erase. The embodiment of the present invention is based on this definition unless otherwise specified. Moreover, after decreasing a threshold voltage of a memory cell in a write state of a high threshold voltage, i.e., after erasing, a memory cell whose threshold voltage has been decreased too low is slightly increased in threshold voltage, which is referred to as post-erase (sometimes called rewrite depending on the documents but their meanings are identical). Moreover, the operation to lower a threshold voltage performed prior to the post-erase is referred to as erase.

As shown in FIG. 24, there is considered a case that the memory cell storing data "1" has a threshold voltage which should be between Ve1 and Ve2. We have examined a following method for rewriting data "0" to "1" in a flash memory. The threshold voltage of a memory cell having a high-state threshold voltage was made lower than the upper voltage allowance by the erase operation. After this, comparatively short write pulse was applied to or write is performed with a comparatively low voltage to those memory cells whose threshold voltage was lower than the lower voltage allowance level Ve1, thereby making the threshold voltage high. This post-erase operation is repeatedly performed, so that the memory cell which should store data "1" has a threshold voltage finally between Ve1 and Ve2.

As a result, if verify is performed with an identical voltage level (Ve1), a memory cell once decided to be "good" may be decided to be "bad" while the verify-is repeatedly performed. This "bad" memory cell is subjected to the post-erase and accordingly, its threshold voltage is increased by the next operation. As a result, on the contrary, the threshold voltage becomes too high exceeding the upper voltage allowance level Ve2, causing a "thrust". This disables convergence of the erase operation.

FIG. 10 shows results of experiment we made. In the graph of FIG. 10, the horizontal axis represents a number of times that the post-erase was repeated; and the vertical axis represents accumulated number of bits corresponding to all the bits to be erased. ● represents a bit whose threshold voltage is within the allowance range; ■ represents a bit lower than the lower voltage allowance level Ve1, i.e., the bit to be post-erased; and ▲ represents a bit higher than the higher voltage allowance level Ve2, i.e., which has caused the "thrust". As is clear from FIG. 10, when verify is performed with an identical voltage, the number of bits which cause the thrust is abruptly increased when the post-erase is repeated 14 times or more.

At this moment, there are still about 0.01% (for example, about 100 bits if the total number of bits is 1 M bits) of bits which are lower than the lower voltage allowance level Ve1 and accordingly, the post-erase cannot be terminated here. If these bits are left as they are, electric current flows into a non-selected memory cell, causing an error as read data. Moreover, when write operation is performed, the electric current is made to flow by this bit and correct write cannot be performed. Moreover, in a multi-value flash memory in which 2-bit data is stored in one memory cell, as show in FIG. 25, it is necessary that a distribution range of threshold voltage corresponding to each of the storage data be within a comparatively narrow range with a high accuracy. Accordingly, the verify decision becomes more strict than the two-value flash memory.

SUMMARY OF THE INVENTION

It is therefore an object of the present invention to provide non-volatile storage circuit such as a flash memory capable of reducing the total time required for erase or write and a semiconductor integrated circuit such as a microcomputer having the non-volatile storage circuit as a built-in component.

The aforementioned and other objects and characteristics of the present invention will be clear from the present specification and the attached drawings.

According to one aspect of the present invention, there is provided a non-volatile storage device comprising a control section and a memory array having a plurality of word lines and a plurality of memory cells connected to the respective word lines, wherein at least some of the memory cells have a threshold voltage contained in a first threshold voltage distribution among two or more threshold voltage distributions the control section selects a predetermined word line from the plurality of word lines, and performs: a first operation, i.e., the control section changes the threshold voltage of the plurality of memory cells connected to the selected word line, from the first threshold voltage distribution to a second threshold voltage distribution; and a second operation, i.e., control section checks whether the threshold voltage of the respective memory cells are contained in the second threshold voltage distribution. In the second operation, among the plurality of memory cells, those memory cells whose threshold voltage is not contained in the second threshold voltage distribution are subjected again to the first operation and the second operation. In the second operation, a predetermined voltage is applied to the respective memory cells, so as to check whether the threshold voltage of the memory cells are contained in the second threshold voltage distribution; and the predetermined voltage is provided in at least three levels. The predetermined voltage applied to memory cells in the second operation performed first is different from the predetermined voltage applied in the second operation performed later.

By the aforementioned aspect, the predetermined voltage used to check whether the threshold voltage of the memory cells is contained in a predetermined threshold voltage distribution is changed in three stages or more in a direction mitigating the decision condition. This prevent non-convergence of write and erase operation and reduce the time required for write and erase.

Moreover, in the decision operation (the second operation) to decide whether the threshold voltage of the memory cells is contained in a predetermined threshold voltage distribution, it is preferable that the predetermined voltage applied to the memory cells be gradually changed in a reverse direction against the change direction of the threshold voltage. This mitigates the decision condition to decide whether the threshold voltage of the memory cells is contained in the predetermined threshold voltage distribution, and increase the speed of convergence of the write and erase operation.

It is further preferable that the operation (first operation) for changing the first threshold voltage distribution to the second threshold voltage distribution be performed by applying a predetermined voltage to the memory cells and the voltage applied to the memory cells in the first operation which is performed later be different from the voltage applied to the memory cells in the first operation which has been performed first. Alternatively, it is possible that the time of the voltage application to the memory cells in the first operation performed later is set different from the time of voltage application to the memory cells in the first operation performed first. This effectively changes the threshold voltage of the memory cells and completes the write and erase in a short time.

According to another aspect of the present invention, the non-volatile storage device comprises a control section and a memory array section which includes a plurality of word lines and a plurality of memory cells connected to the respective word lines. Each of the memory cells has a threshold voltage contained in the first threshold voltage distribution among two ore more threshold voltage distributions. When the first threshold voltage distribution is higher than the second threshold voltage distribution, the control section performs the first operation to change to a threshold voltage lower than the upper limit of the second threshold voltage distribution. After this, those memory cells which have a threshold voltage lower than the lower limit of the second threshold voltage distribution detected in the second operation are changed in their threshold voltage to a threshold voltage higher than the lower voltage as a third operation and check is made to determine whether the respective threshold voltage of the memory cells are higher than the lower limit as a fourth operation. The third operation and the fourth operation are repeatedly performed. In the fourth operation, a predetermined voltage is applied to check whether the respective memory cells have a threshold voltage higher than the aforementioned lower limit. The predetermined voltage applied to the memory cells in the fourth operation performed first is made higher than the voltage equivalent to the lower limit of the second threshold voltage distribution. Alternatively, when the first threshold voltage distribution is lower than the second threshold voltage distribution, the fourth operation changes the predetermined voltage applied to the memory cells in the fourth operation performed first lower than the voltage equivalent to the upper limit of the second threshold voltage distribution. Thus, it is possible to prevent non-convergence of the write and erase, complete the write and erase in a short time, and reduce the threshold voltage distribution width and increase the read margin.

According to still another aspect of the present invention, there is provided a non-volatile storage system comprising a control device and one or more non-volatile storage devices, wherein the control device can set a first operation mode or a second operation mode in the non-volatile storage device(s); each of the non-volatile storage devices includes a control section and a memory array section; the memory array section has a plurality of word lines and a plurality of memory cells respectively connected to the word lines; each of the memory cells has a threshold voltage contained in a first threshold voltage distribution among two or more threshold voltage distributions. The control section selects a predetermined word line from the plurality of word lines, and performs: a first operation, i.e., the control section changes the threshold voltage of the plurality of memory cells connected to the selected word line, from the first threshold voltage distribution to a second threshold voltage distribution; and a second operation, i.e., control section checks whether the threshold voltage of the respective memory cells are contained in the second threshold voltage distribution. In the second operation, among the plurality of memory cells, those memory cells whose threshold voltage is not contained in the second threshold voltage distribution are subjected again to the first operation and the second operation. In the second operation, a predetermined voltage is applied to the respective memory cells, so as to check whether the threshold voltage of the memory cells are contained in the second threshold voltage distribution; the predetermined voltage is provided in at least three levels; and in the first operation mode, the predetermined voltage applied to a memory cell in the second operation is different from the predetermined voltage applied to the memory cell in the second operation performed later.

By the aforementioned aspect, the predetermined voltage used to check whether the threshold voltage of the memory cells is contained in a predetermined threshold voltage distribution is changed in at least three stages in the direction to mitigate the decision condition. This prevents non-convergence of write and erase operation and can complete write and erase in a short time, thereby realizing a system having a high throughput.

DETAILED DESCRIPTION OF THE EMBODIMENTS

Description will now be directed to embodiments of the present invention with reference to the attached drawings.

Figure 1A:
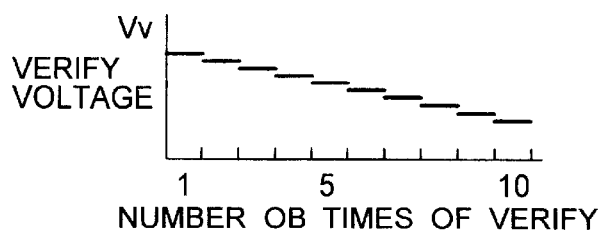
FIGS. 1A to 1C show an outline of a verify method according to a first embodiment of the present invention.
Figure 1B:
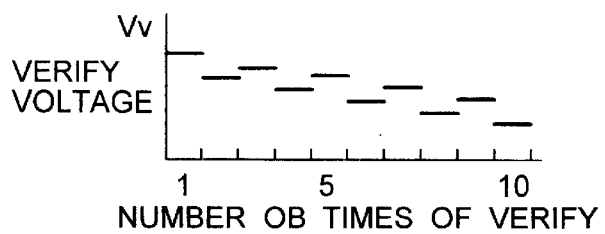
Figure 1C:
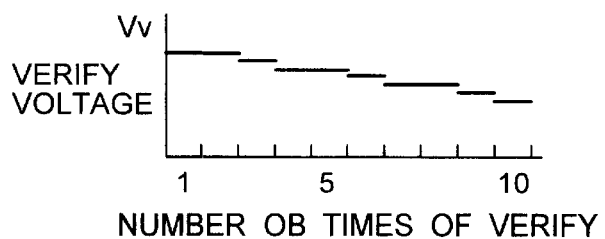
Figure 2A:
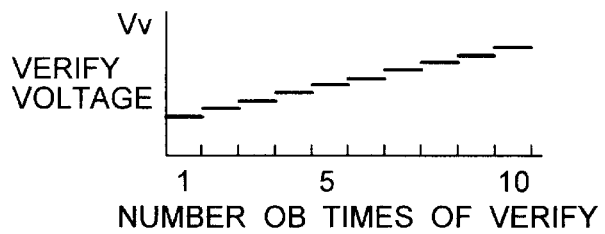
FIGS. 2A to 2C show an outline of a verify method according to a second embodiment of the present invention.
Figure 2B:
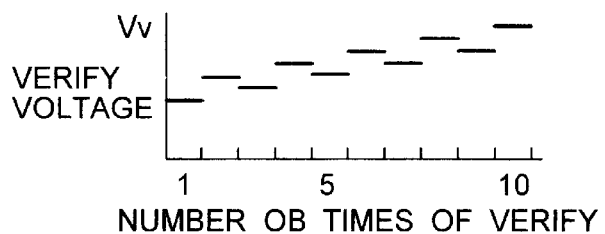
Figure 2C:
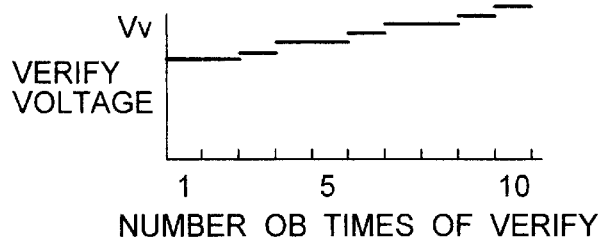
Figure 3:
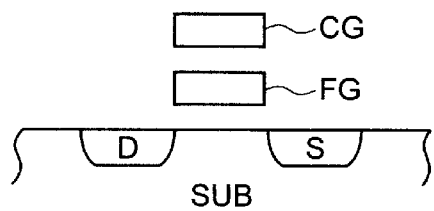
FIG. 3 is a cross sectional view showing a configuration of a storage element constituting a flash memory to which the present invention can effectively be applied.

FIGS. 1A to 1C show an outline of a verify method according to a first embodiment of the present invention:

FIG. 1A shows a first example, FIG. 1B shows a second example, and FIG. 2C shows a third example. It should be noted that the non-volatile storage element used in this embodiment is not to be limited to a particular one. However, it is assumed, as shown in FIG. 3, that the element is MOSFET having a two-layered gate structure including a control gate CG and a floating gate FG formed on a semiconductor substrate SUB via an insulation film. When this storage element is used to constitute a memory array, normally, the control gate CG is connected to a word line, the drain D is connected to a bit line, and the source S is connected to a common source line, for example, to which grinding potential is applied.

Figure 4A:
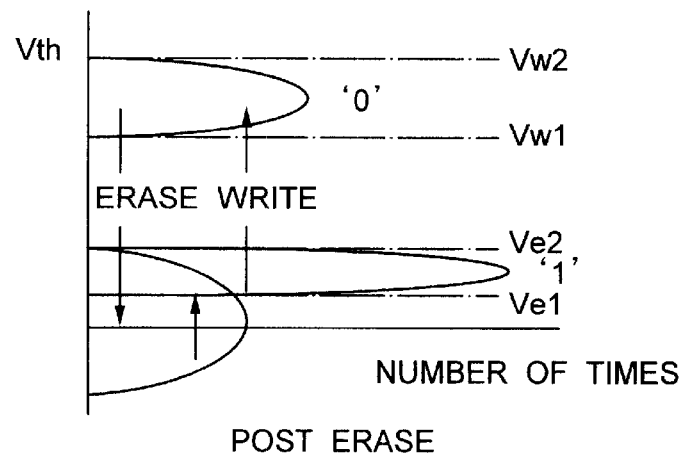
FIGS. 4A and 4B are threshold voltage distribution diagrams showing distribution of the threshold voltages after write and erase in the flash memory to which the present invention can effectively be applied.

In FIG. 1A, as shown in FIG. 4A for example, post-erase operation is repeatedly performed in a non-volatile memory in which data "0" corresponds to a high threshold voltage state of the storage element and data "1" corresponds to a low threshold voltage stage. When data "0" is rewritten to "1", erase operation is performed to lower the threshold voltage of the storage element in a high threshold voltage state, below the higher voltage allowance level Ve2. After this, the storage element whose threshold voltage has become lower than the lower voltage allowance level Ve1 is subjected to the post-erase operation, i.e., a comparatively short write pulse is applied or write is performed with a comparatively low voltage, so as to increase the threshold voltage. This post-erase operation is repeatedly performed and its verify voltage Vv is gradually lowered, i.e., decision condition becomes gradually less strict while the number of times of repetition increases.

It should be noted that the first verify voltage is not limited to a particular value but is preferably set slightly higher than the lower limit value of the threshold voltage distribution and after that, the verify voltage is gradually lowered and becomes a target lower limit value when all the memory cells have good decision results.

FIG. 1B also shows the verify voltage Vv when performing the post-erase operation in the non-volatile memory as has been described above. When the post-erase operation is repeated, the verify voltage Vv is set as follows. When the second post-erase is performed, the verify voltage Vv is set lower than the first post-erase. When the third post-erase is performed, the verify voltage Vv is set higher than the second (immediately preceding) post-erase but lower than the first (preceding the immediately preceding) post-erase. Moreover, FIG. 1C shows a variation of FIG. 1A. That is, the verify operation of odd numbers are performed a plurality of times (twice for example) with an identical verify voltage. It should be noted that this first embodiment can also be applied to a data rewrite operation as follows: a threshold voltage of a storage element in a low threshold voltage is made higher than the lower voltage allowance level Vw1 by the write operation.

The aforementioned prior art (JP-A-2000-90675) shows an example of mitigating the verify condition only at the last time and an example of alternately using two stages of verify voltage. In contrast to this, in the present embodiment the verify conditions are gradually mitigated over the three stages or more. Thus, this embodiment is different from the aforementioned pior art in that the verify condition is further mitigated.

Moreover, in the aforementioned prior art, the threshold voltage is gradually changed in one direction to mitigate the condition for verify operation while in the present invention, the threshold voltage is shifted by erase or write, after which post-erase or post-write is performed to return the threshold voltage in the opposite direction. Thus, consideration is taken on the excessive returning of the threshold voltage, i.e., the thrust in a technique for narrowing the spread of threshold voltage distribution.

Figure 9:
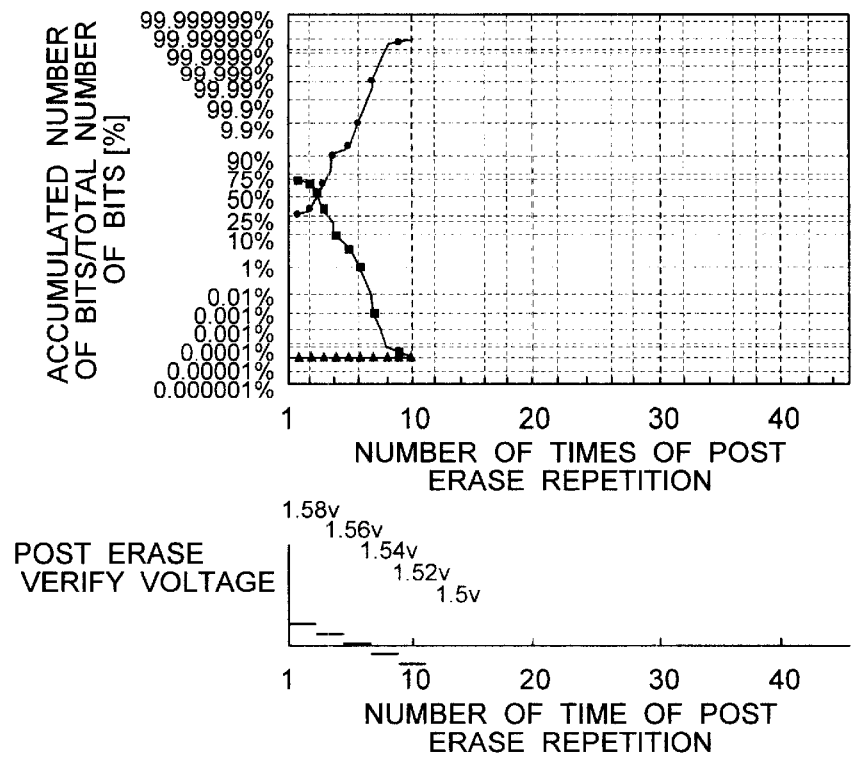
FIG. 9 shows a relationship when the post erase is performed according to a first example of the first embodiment, i.e., the relationship between the number of times of post erase repeated and the number of total bits including the number of accumulated bits against number of all the bits in the allowable range after the erase and the number of total bits exceeding the allowable range.

FIG. 9 shows results of post-erase performed according to Example 1 of the first embodiment (FIG. 1A) by performing verify with identical voltage twice and gradually lowering the verify voltage in steps such as 1.58V, 1.56V, 1.54, 1.52V, and 1.5V. The horizontal axis represents the number of times of post-erases repeated, and the vertical axis represents an accumulated number of bits for all the bits to be erased. ● represents a bit whose threshold voltage is within the allowance range; ■ represents a bit lower than the lower voltage allowance level Ve1, i.e., the bit to be post-erased; and ▲ represents a bit higher than the higher voltage allowance level Ve2, i.e., which has caused the "thrust".

Figure 10:
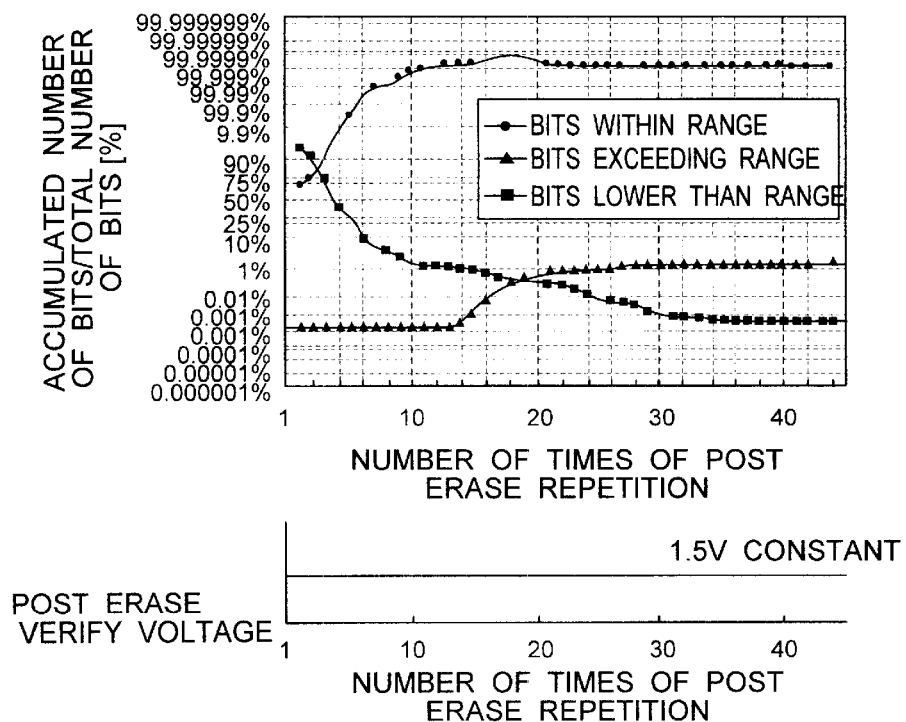
FIG. 10 is a graph showing a relationship between the number of times of post erase repetition when the post erase is performed in the conventional way and the number of accumulated bits against the number of total bits in an allowable range and a number of bits exceeding the allowable range after the erase.

From FIG. 9, it can be seen that when the post-erase is repeated while modifying the verify voltage in the direction of looser decision condition, at about the tenth post-erase, the number of bits within the allowance range reaches 99.9999% (for the total number of 1 M bits), and on the contrary, the number of bits lower than the lower voltage allowance level Ve1 is not greater than 0.00001% (the number of bits 0 bit), during which the number of bits causing the thrust is hardly increased. When this FIG. 9 is compared to FIG. 10 showing results of verify repeated with an identical voltage according to the prior art, it is clear that when verify is repeated with the same voltage, as the number of erases increases, the number of bits causing the thrust is increased not converging the erase operation. In contrast to this, according to the present invention in which the verify voltage is gradually mitigated for performing the post-erase, it is possible to terminate the erase operation at about 10-th time of repetition.

FIGS. 2A to 2C show an outline of the verify method according to a second embodiment of the present invention. FIG. 2A shows Example 1, FIG. 2B shows Example 2, and FIG. 2C shows Example 3.

Figure 4B:
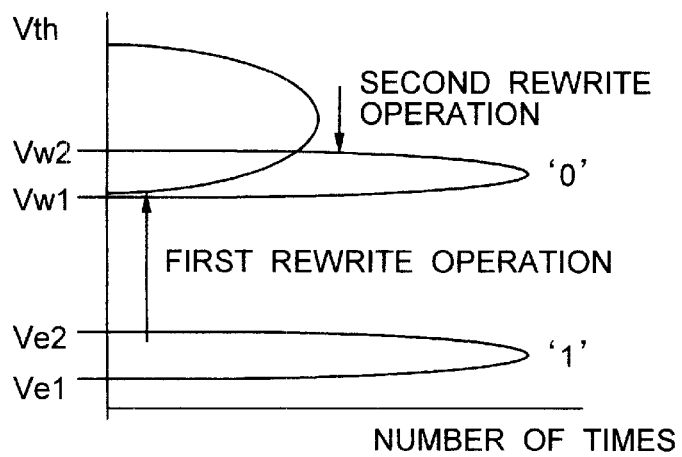

FIG. 2A, as shown in FIG. 4B for example, shows data rewrite from "1" to "0" in a non-volatile memory in which data "0" corresponds to a high threshold voltage state of the storage element and data "1" corresponds to a low threshold voltage state. That is, the threshold voltage of the storage element in a low value voltage state is increased higher than the low voltage allowance level Vw1 by the write operation and the storage element whose threshold voltage has become higher than the higher voltage allowance level Vw2 is subjected to a comparatively short erase pulse to lower the threshold voltage, which is the post write operation. The verify voltage used when repeating the post-write operation is gradually changed in the looser decision condition, i.e., gradually increased as the number of times is increased.

It should be noted that the verify voltage is preferably set as follows, although not limited to this. The first verify voltage is set slightly lower than the upper limit of the target threshold voltage distribution , after which the verify voltage is gradually increased and controlled to reach the upper limit as a target when all the memory cell decision results can pass.

FIG. 2B shows the verify voltage V when repeatedly performing the post-write a non-volatile memory having the aforementioned configuration. At the second time, the voltage is made higher than the first time. At the third time and after, the voltage is made lower than the second time (immediately preceding time) but higher than the first time (preceding the immediately preceding time). Moreover, FIG. 2C shows a case when the verify operation at the odd number of times in FIG. 2A is repeated a plurality of times (twice for example) with identical verify voltages. It should be noted this second embodiment can also be applied to data rewrite such a manner that the threshold voltage of the storage element in a high threshold voltage state is made lower than the higher voltage allowance level Ve2 by the erase operation.

Figure 5:
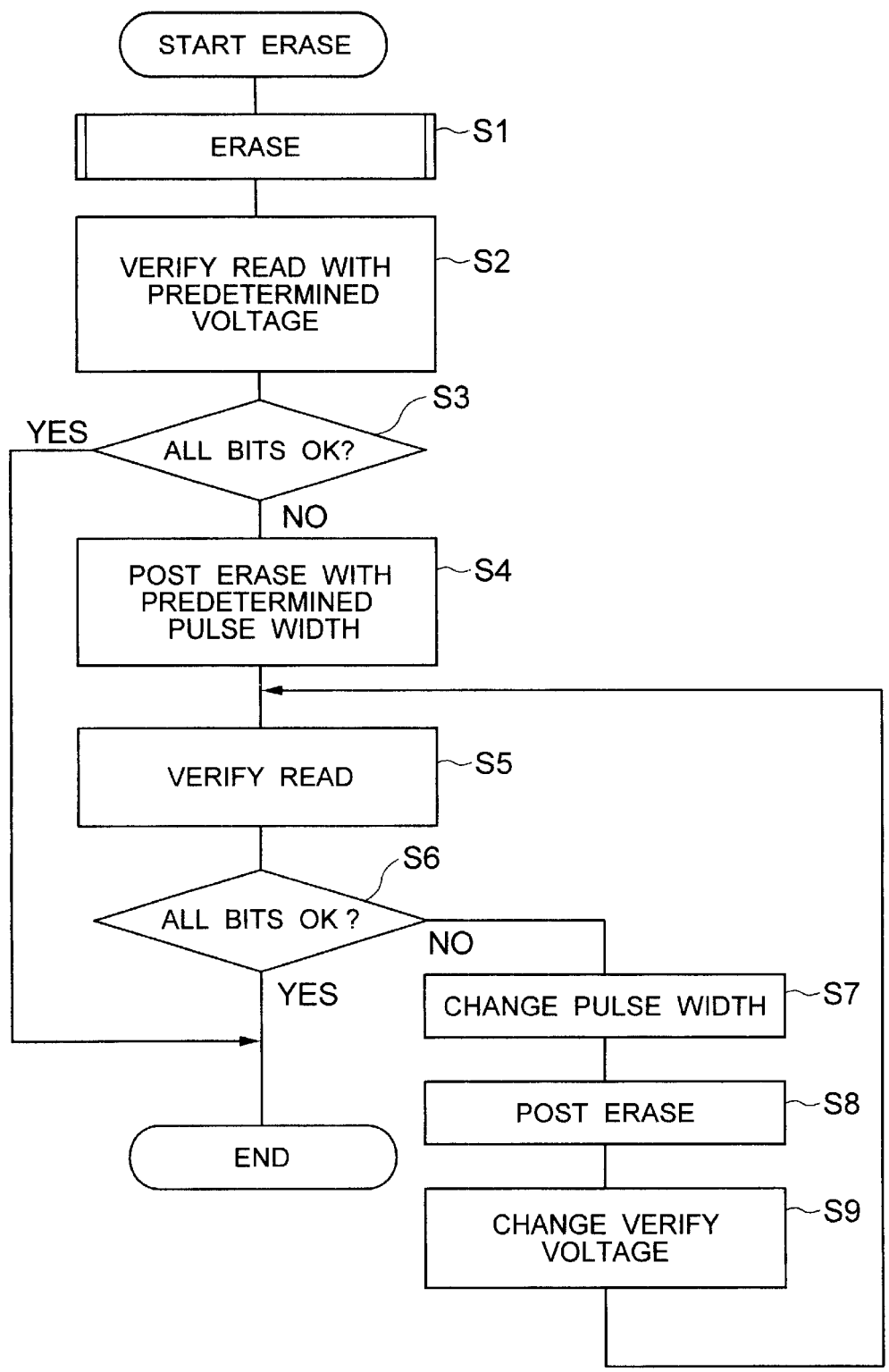
FIG. 5 is a flowchart showing procedure of a verify method according to a third embodiment of the present invention.
Figure 6A:
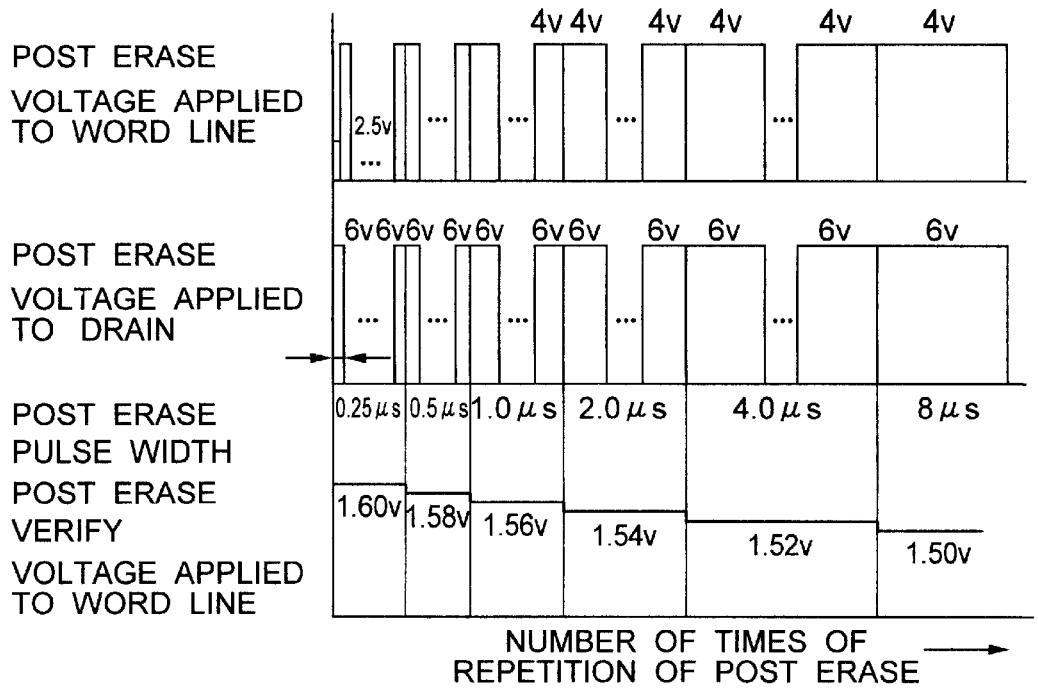
FIGS. 6A and 6B show changes of voltages applied in the verify method according to the third embodiment of the present invention.

Next, explanation will be given on a third embodiment of the present invention with reference to FIG. 5 and FIGS. 6A and 6B. In this third embodiment, in the repeated post-erase or post-write operation the verify voltage is gradually changed in a direction to loosen (mitigate) the decision condition, and the voltage to be applied to the storage element is also changed. FIG. 5 shows this erase operation procedure.

As shown in FIG. 5, in this embodiment, when erase (step S1) is complete, a verify read is performed with a predetermined work line voltage (step S2). It should be noted that it is also possible to repeat erase verify a plurality of times by performing the erase operation with the erase and the voltage Ve2 and decrease the threshold value of the object bit down to Ve2 voltage or below. Step S3 checks whether all the bits exceed a predetermined threshold value 1. If Yes, the erase operation is terminated. If there is still any bit not exceeding the value, control is passed to step S4, a voltage of a predetermined pulse width is applied to the storage element so as to perform post-erase.

After this, in step S5, verify read is again performed and step S6 checks whether all the bits exceed the predetermined threshold value Ve1. If Yes, the erase is terminated. If any bit does not exceed, control is passed to step 7, where the pulse width is modified. Then, in step S8, post-erase is performed by the modified pulse width and the verify voltage is modified (step S9). Then, control is passed back to S5, where verify read is performed and step S6 checks whether all the bits exceed the threshold value Ve1.

The aforementioned operation is repeated modifying the pulse width and gradually mitigating the verify voltage for the post-erase and the erase is terminated when all the bits exceed the predetermined threshold value Ve1. It should be noted that the first and second embodiments may be considered to correspond to the flowchart of FIG. 5 except for that the pulse width modification in step S7 is omitted and after performing the post-erase, in step S9, the verify voltage is modified.

Next, explanation will be given on the pulse width modification in step S7. In this example, as shown in FIG. 6A, the verify voltage for the post-erase is successively changed from 1.60 V, to 158 V, 1.56 V, 1.54 V, 1.52 V, 1.50 V. In accordance with this voltage modification, the pulse width of the word line application voltage and the drain application voltage is successively increased as follows: 0.5 $\mu$s, 1.0 $\mu$s, 2.0 $\mu$s, 4.0 $\mu$s, 8.0 $\mu$s. However, the voltage of the post-erase is constant (4 V and 6 V).

Figure 7A:
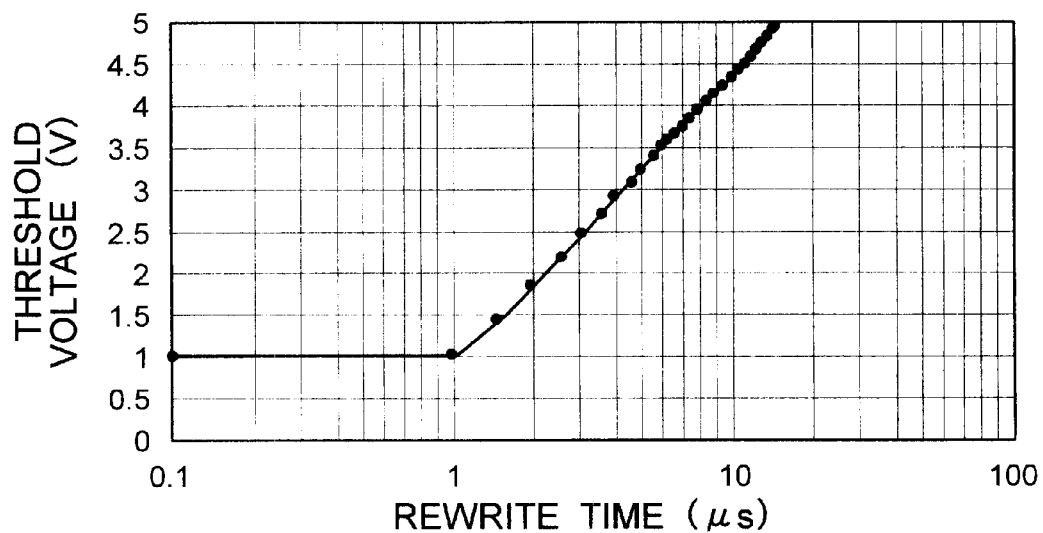
FIG. 7A shows a relationship between the threshold voltage change and the rewrite time when a storage element in a low state of threshold voltage is re-written into a high state of the threshold voltage while maintaining the pulse width of the word line application voltage and the drain application voltage constant.
Figure 7B:
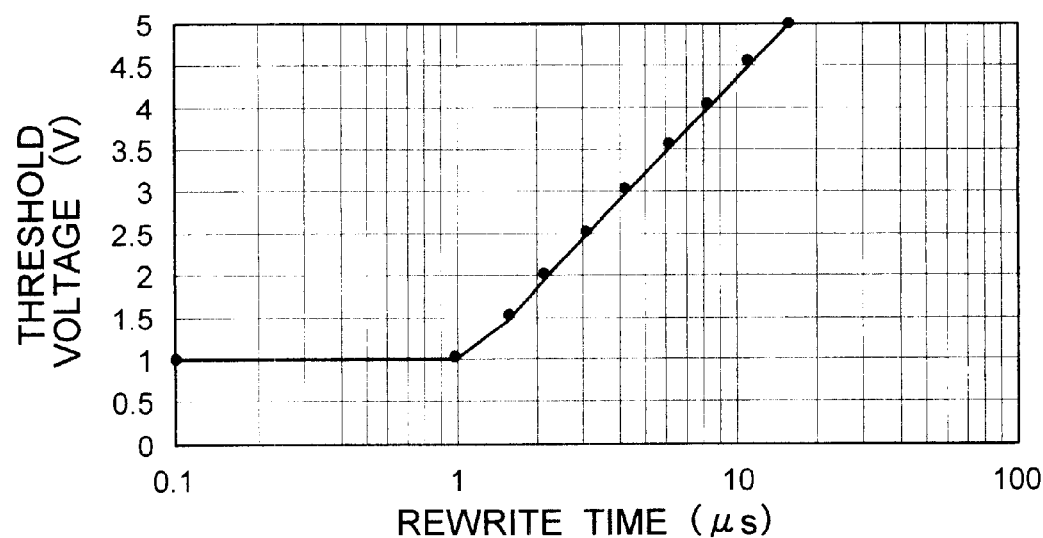
FIG. 7B shows a relationship between the threshold voltage change and the rewrite time when a rewrite is performed while changing the pulse width of the word line application voltage and the drain application voltage constant.

FIG. 7A shows a relationship between the threshold voltage and the rewrite time in case the word line application voltage and the drain application voltage have a constant pulse width (0.5 $\mu$s) and a storage element in a low threshold voltage state is rewritten into a high threshold voltage state. FIG. 7B shows a relationship between the threshold voltage and the rewrite time in case the word line application voltage and the drain application voltage have a pulse width successively changed as in the aforementioned example, and a storage element in a low threshold voltage state is rewritten into a high threshold voltage state.

In FIGS. 7A and 7B, ● represents a simulated plot of a threshold voltage of a storage element at a certain number of times and an accumulated total rewrite time. As is clear from comparison of FIG. 7A to FIG. 7B, when the pulse width is constant as in FIG. 7A, the threshold voltage does not increase so much even when the number of rewrite times is increased. When the pulse width is successively increased as in FIG. 7B, the threshold voltage is increased more than in FIG. 7A (the threshold value change amount is constant). That is, when the pulse width is successively increased, a desired threshold voltage can be obtained with less number of rewrites. If the post-erase is repeated in the conventional way without modifying the verify voltage and the pulse width, as is clear from FIG. 10, more and more storage elements cause the threshold voltage thrust as the number of times of repetition is increased, which may disable rewrite convergence. By modifying the verify voltage and pulse width, it is possible to evade the aforementioned thrust and converge the rewrite with less number of repetitions.

Figure 6B:
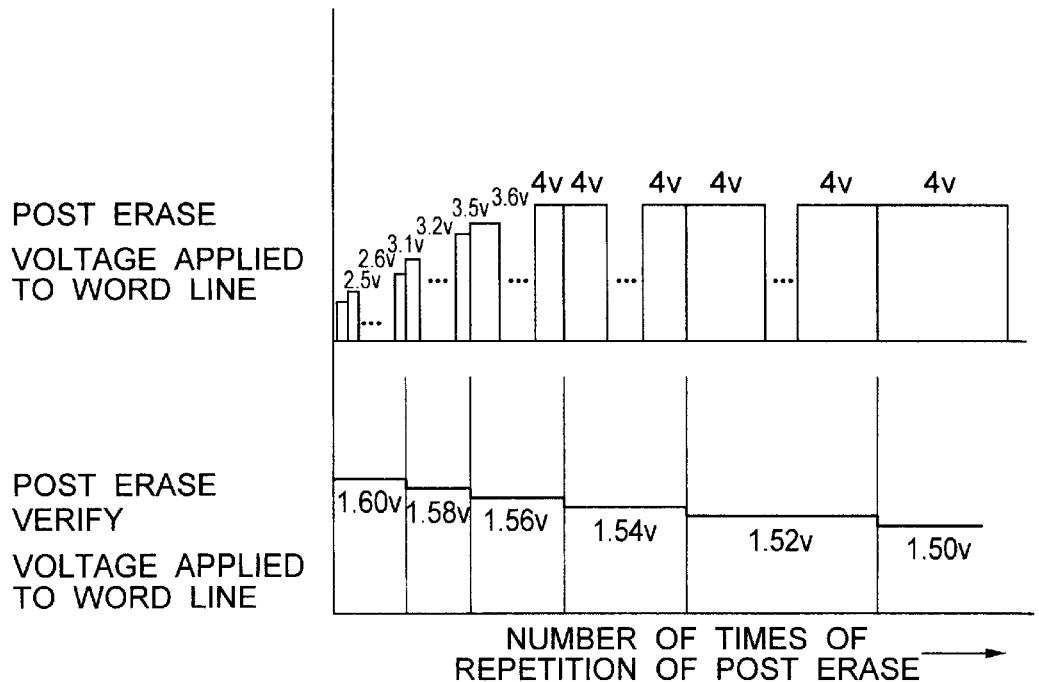

It should be noted that in the aforementioned example, only the pulse width is changed but in accordance with the number of times of rewrite, it is also possible to modify the pulse width of the post-erase word line application voltage and the post-erase drain application voltage as well as successively change the word line voltage level to 2.5 V, 2.6 V, 2.7 V . . . 4V as shown in FIG. 6B.

Figure 8:
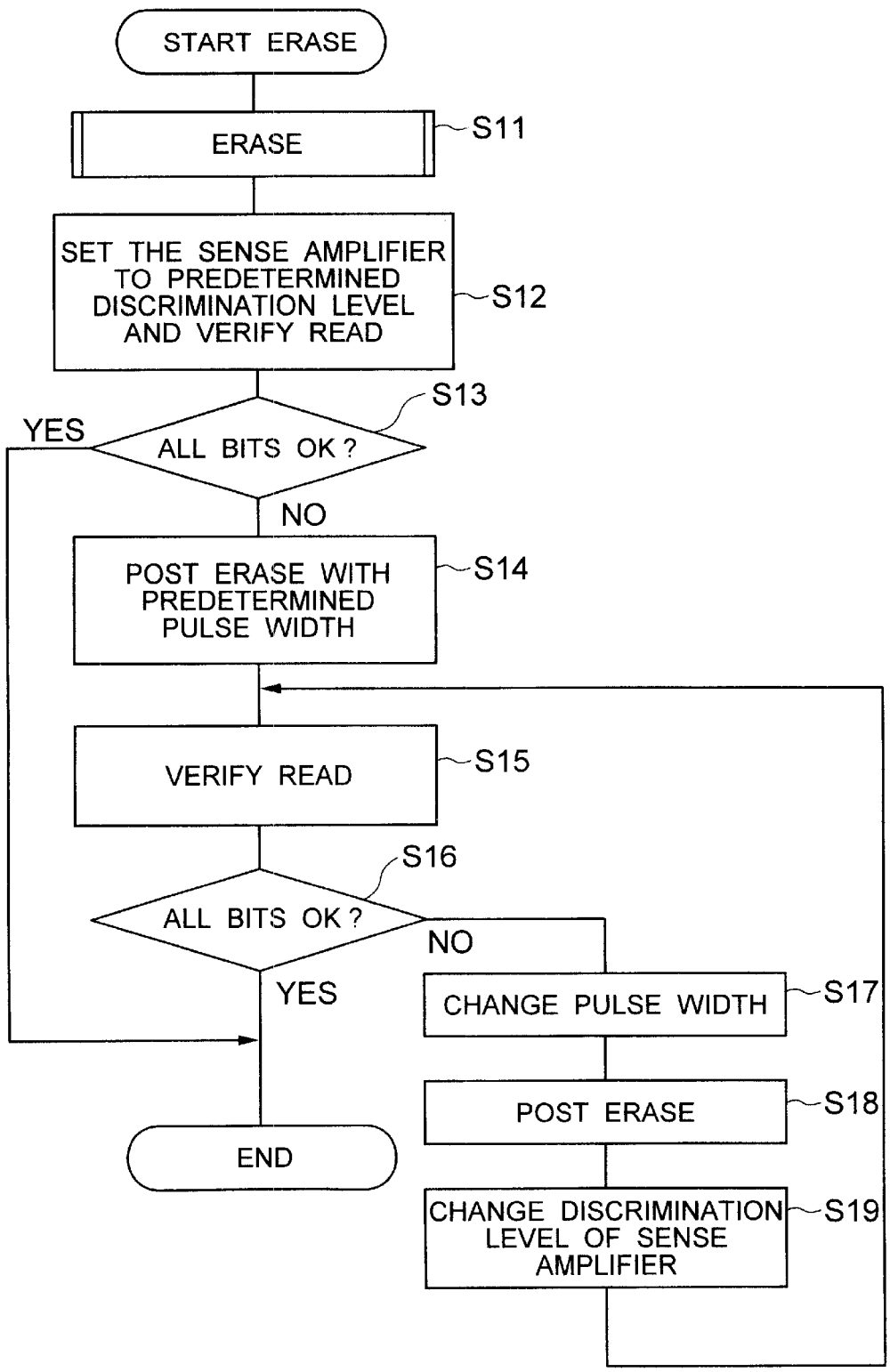
FIG. 8 is a flowchart showing a procedure of a verify method according to a fourth embodiment.

Next, explanation will be given on a fourth embodiment of the present invention. Instead of the verify voltage gradually changing to mitigate the decision condition in the first and the second embodiments, in this fourth embodiment, a discrimination level in the sense amplifier is being changed in a direction gradually mitigate the decision condition while repeating the post-erase or post-write. FIG. 8 shows an erase operation procedure involved. In this flowchart also, the pulse width is changed each time the post-erase is repeated. As in the first and second embodiments, it is possible to modify only the discrimination level in the sense amplifier without modifying the pulse width.

As shown in FIG. 8, in this embodiment, when an erase (step 11) is complete, firstly, the discrimination level of the sense amplifier is set to a predetermined voltage level and verify read (step S12) is executed. Then, step S13 checks whether all the bits exceed the predetermined value voltage Ve1. if Yes, the erase is terminated. If any bit does not exceed the Ve1, control is passed to step S14, where a voltage having a predetermined pulse width is applied to the storage element, thereby performing the post-erase.

After this, in step S15, verify read is again performed. Step 16 checks whether all the bits exceed the predetermined threshold voltage Ve1. If Yes, the erase is terminated. If No, control is passed to step S17, where the pulse width is modified. Then, in step S18, the post-erase is executed with a modified pulse width, and the discrimination level of the sense amplifier is modified (step S19). Control is passed back to FIG. 15, where the verify read is performed by the sense amplifier with the modified discrimination level and step S16 checks whether all the bits exceed the threshold voltage Ve1.

The aforementioned operation is repeated while modifying the pulse width and modifying the discrimination level of the sense amplifier gradually in the direction to mitigate the decision level, thereby performing the post-erase. When all the bits exceed the predetermined value voltage Ve1, the erase is terminated. It should be noted that in this example also, the pulse width modification in step S17 does not necessarily have to be provided. Together with the pulse width modification, the voltage level applied may be gradually increased in accordance with the number of times of repetition. Moreover, not only the erase operation for reducing the threshold voltage but also write operation for increasing a threshold voltage may be realized according to the procedure shown in the flowchart of FIG. 8.

Next, explanation will be given on an example when the present invention is applied to a flash memory built in a single-chip microcomputer.

Figure 11:
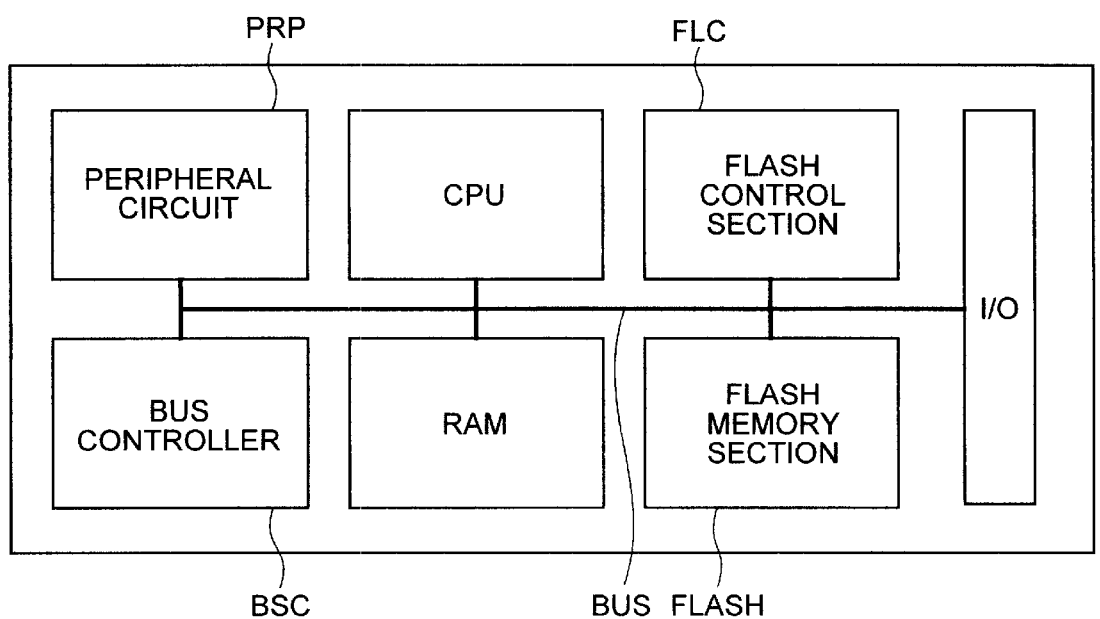
FIG. 11 is a block diagram showing an example of microcomputer having a built-in flash according to the present invention.

FIG. 11 is a block diagram briefly showing a microcomputer having a built-in flash memory. Each of the circuit blocks shown in FIG. 11 is formed on a single semiconductor chip such as a monolithic silicon.

In FIG. 11 the block named FLASH represents a flash memory section having memory arrays including non-volatile elements; a block named FLC is a flash control section for indicating write and erase to the flash memory section; CPU is a central processing unit governing control of the entire chip; RAM is a random access memory temporarily storing data and providing a work area for the central processing unit CPU; PRP is a peripheral circuit including various timer circuits, an A/D converter circuit, a watch dog timer for monitoring the system, and the like; BUS is an internal bus connecting the central processing unit CPU to the flash memory section FLASH, the flash control section FLC, and RAM; I/O is an interface circuit including an I/O buffer for outputting a signal from the internal BUS to an external bus and fetching a signal from the external bus and an I/O port such as a serial communication port for communication with an external device; and BSC is a bus controller per controlling the bus occupy state of the internal BUS.

Though not shown in FIG. 11, it is possible to provide in addition to the aforementioned circuit blocks: an interrupt control circuit for checking a generation and a priority of an interrupt request and interrupting the CPU; a DMA (direct memory access) transfer control circuit for controlling a DMA transfer between the RAM and the peripheral circuit PRP and the flash memory section FLASH, and the like; an oscillator generation a clock signal required for operation of the system.

Figure 12:
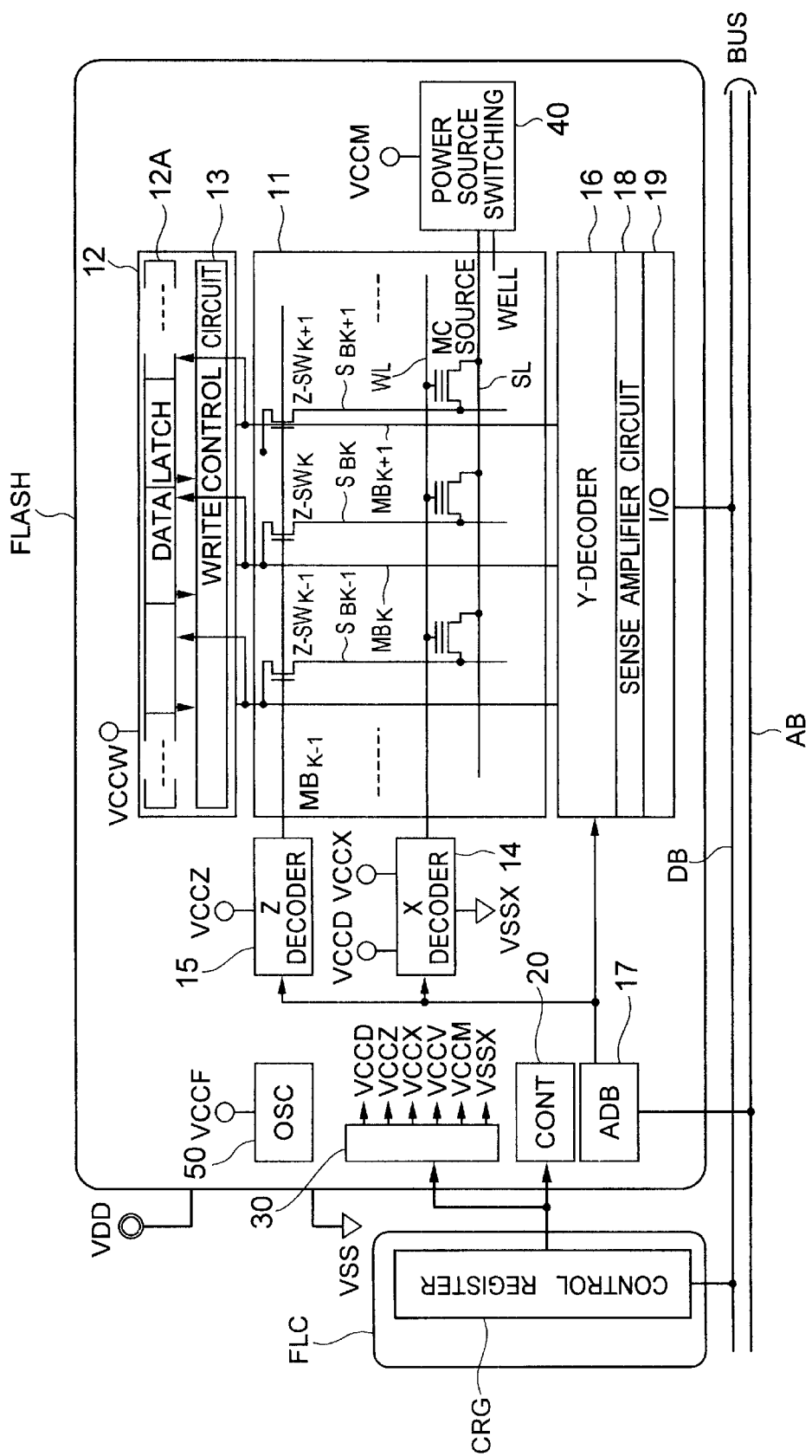
FIG. 12 is a block diagram showing a configuration example of a flash memory section according to the present invention.

FIG. 12 shows configuration of the flash memory section FLASH. In FIG. 12, a reference number 11 denotes a memory array of memory cells, arranged in matrix shape, as non-volatile storage elements including MOSFET having a control gate and a floating gate. A reference number 12 is a latch control circuit which performs write to the memory array 11 according to write data supplied from outside. This write latch control circuit 12, for example, includes a data latch 12A and a write control circuit 13. The data latch 12A contains data of the number of bits corresponding to the number of memory cells connected to one word line such as 128 bytes for example. According to the data contained in this data latch 12A, the write control circuit 13 applies a write pulse to the bit line in the memory array 11. It should be noted that the data latch 12A may have the number of bits not corresponding to the number of memory cells in the word line direction, i.e., not corresponding to the number of bit lines in the memory array 11. Its unit fraction may be the number of bits, which can be supplied to any of the corresponding bit lines via a selector (multiplexer) and the like.

Moreover, the memory array 11 of this example is hierarchically constructed in the row direction. Memory cells of each row constitute, for example, a 64-unit block having drains connected to a common sub bit line SB, which in turn is connected via a selector switch MOSFET Z-SW to a main bit line MB. For example, 64 memory cells connected to the same sub bit line and memory cells sharing a word line with these memory cells have their sources connected to a common source line SL. These memory cells sharing the source are formed on a single well region formed on the semiconductor substrate surface. Hereinafter, this will be referred to as a block. It should be noted that a plurality of blocks may also be erased at once.

On the other hand, control gates of memory cells MC arranged in the lateral direction, i.e., column direction are connected on column basis to a common word line WL. For example, 128×8 memory cells connected to a single word line constitute one sector which is used as a write unit. It should be noted that in FIG. 2, subscripts k−1, k, k+1 attached to SB and MB are used to identify bits such as a positive integer from 0 to 1023. Moreover, in this specification, the phrase "bit line" represents the main bit line unless otherwise specified. It should be noted that the memory connection method is not to be limited to the aforementioned.

Numeral 14 represents an X-decoder circuit for deciding an X-based address signal fetched from the address bus AB and selecting a word line WL corresponding to the X-based address from the word lines in the memory array 11; 15 represents a Z-decoder for decoding the Z-based address signal for selecting a block and controlling on/off of the selector switch MOSFET Z-SW for connecting the sub bit line SB to the main bit line MB; 16 represents a Y-decoder circuit for decoding a Y-based address signal fetched from the address bus and selecting a 1-byte (or 1-word) data in the sector; 17 represents an address buffer circuit (ADB) for fetching an address signal supplied via the address bus from the CPU; and 18 represents a sense amplifier for amplifying the data signal read to the main bit line MB of the memory cell array 11 and outputting the data signal.

The flash memory section of this example further includes: an I/O buffer circuit 19 arranged between the sense amplifier 18 and the data bus DB for input/output of a data signal; a control circuit 20 for generating a control signal supplied to the respective circuits in the flash memory according to a control signal from outside; a power circuit (VS) 30 for generating voltage according to a power source voltage Vcc supplied from outside, such as write voltage, erase voltage, read voltage, and verify voltage required in the chip, selecting a desired voltage according to the memory operation state, and supplying it to the write control circuit 13 , the X-decoder circuit 14, and the like; well-source power source switching circuit 40 for switching voltage of the source line and the well region, i.e., upon erase, opening the common source line and applying boost voltage to the well region WELL, and upon write and read, applying the grinding potential to the source line and the well region; an oscillation circuit 50 for generating a clock signal required for boost operation.

On the other hand, the flash control section FLC includes, for example, a control register CRt as a main component and some peripheral circuits are added to the register. The CPU operates according to programs stored in the flash memory and the RAM. When write is executed to the control register CRG, the flash control section FLC sends a start signal to the control circuit 20 and the power source circuit 30 in the flash memory section FLASH according to the bit state of the control register CRG, so as to perform write, erase, read, verify, and the like .

In addition to the control register CRG for controlling write and erase, the flash control section FLC may include a register for setting a value for voltage trimming and a register for holding help information to replace a memory row having a defective bit in the memory array by a reserved memory row. It should be noted that a value of the trimming register may be stored in a predetermined area of the memory array 11 of the flash memory section FLASH and is read from the flash memory section and set in the trimming register upon reset.

Figure 13A:
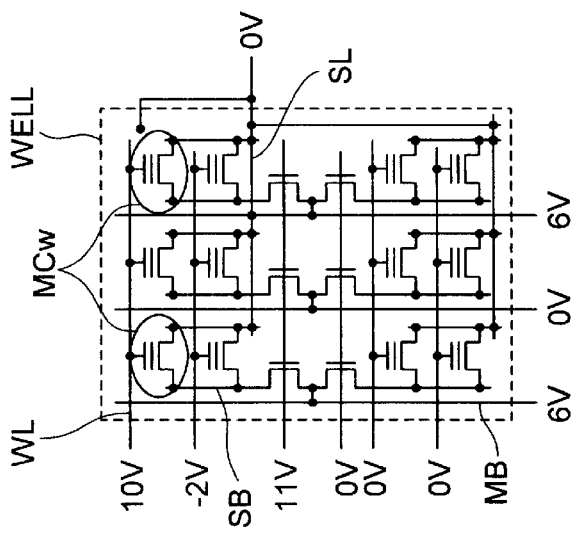
FIGS. 13A to 13C show specific examples of a memory array of the flash memory circuit and examples of bias voltages during erase, post erase, and write.
Figure 13B:
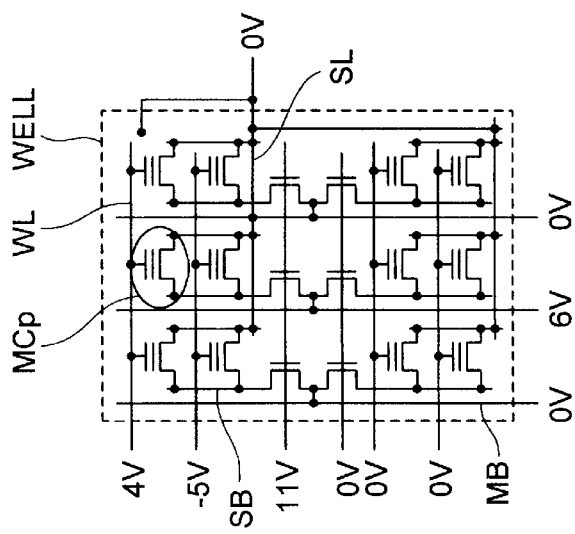
Figure 13C:
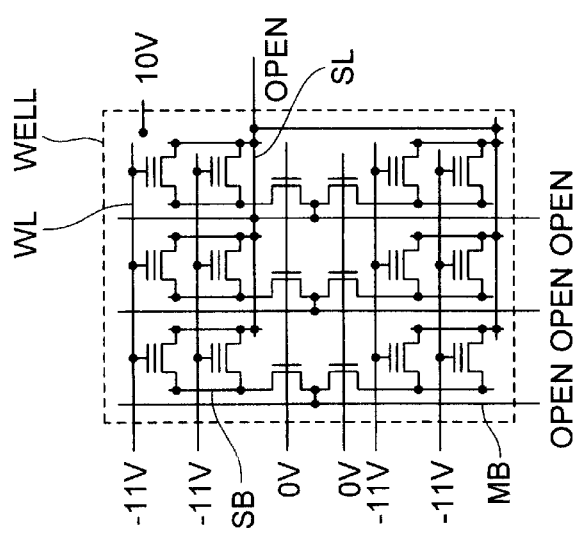
Figures 14A, 14B, 14C:
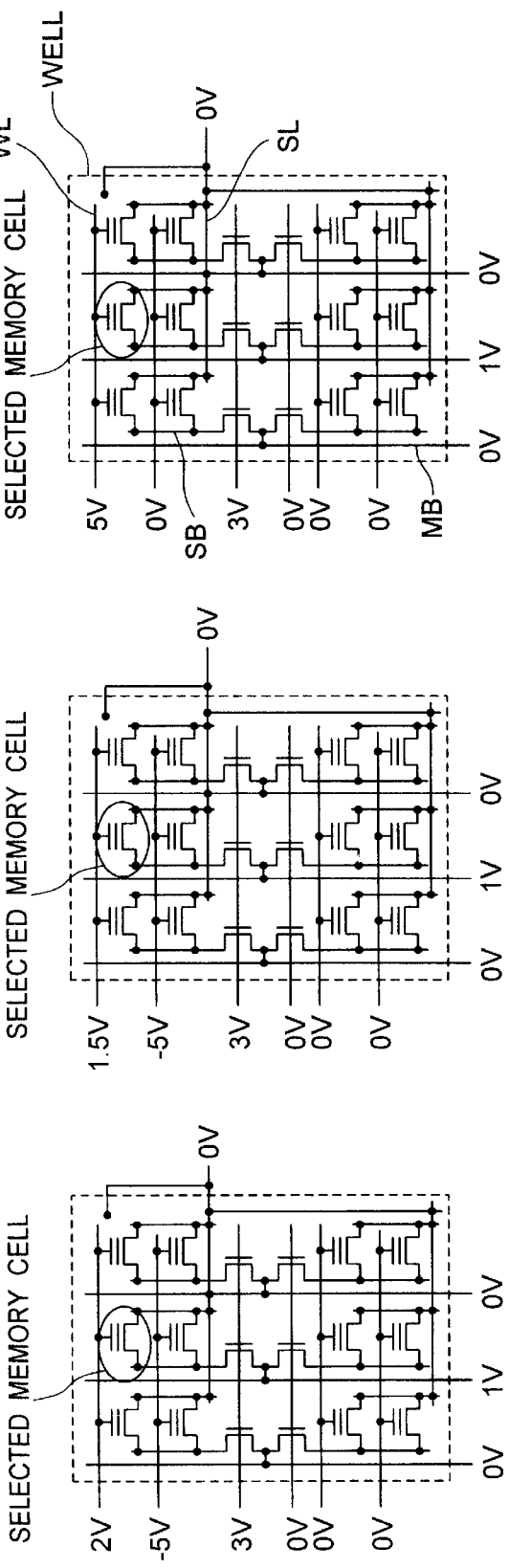
FIGS. 14A to 14C illustrate circuits showing bias voltage during an erase verify, post erase verify, and write verify in the flash memory circuit of the examples.

FIGS. 13A to 13C show an example of voltage application to the word line WL, the bit line MB, and the common source line SL, and the well WELL during the aforementioned erase, post-erase, and write. FIGS. 14A to 14C show an example of voltage application to the word line WL, the bit line MB, and the common source line SL, and to the well WELL during an erase verify, post-erase verify, and write verify. In these operations, as has been described above, according to the number of times of verify repetition, the potential condition of the word line WL is gradually modified in a mitigation direction. It should be noted that during an ordinary read, voltage values applied to the word line WL, the bit line MB, and the common source line SL, and the well WELL are identical to FIG. 14C excluding that the word line WL potential is not 5 V but 3 V.

In this example, when erase operation is performed by making the threshold voltage of memory cells from high to low state, voltage as shown FIG. 13 A is applied at once to all the memory cells of the block sharing the well, so as to pull out electric charge from the floating gate. Accordingly, memory cells originally having a lower threshold voltage may become too low in the threshold voltage. When the threshold value of a memory cell becomes 0V or below, drain current flows to the memory cell even if the word line is at a non-selection level (0V) and it becomes impossible to correctly read data from the selected memory cells sharing the sub bit line SB. To cope with this, the memory cells having too low threshold voltage are slightly increased in the threshold voltage, as the post-erase. Thus, it is possible to limit the threshold voltage distribution within a desired range.

During the erase operation, as shown in FIG. 13A, in the selected blocks (two vertically symmetric blocks in FIGS. 13A to 13C), the bit line MB and the common source line SL are made open, i.e., in a potentially floating state. −11V is applied to the word line WL and 10 V is applied to the well. Thus, negative charge (electrons) are pulled out of the floating gate and the threshold voltage is made lower.

During write, as shown in FIG. 13C, 10 V is applied to the word line WL of the selected memory cell, i.e., to the control gate and 6 V is applied to the bit line, i.e., to the drain while grinding potential is applied to the common source line SL and to the well. Drain current flows into the selected memory cells and hot electrons generated are injected into the floating gate to increase the threshold voltage. Here, a high voltage of 11 V is applied to the MOSFET Z-SW gate between the sub bit line SB and the main bit line MB connected to the selected memory cells and the gate becomes ON state and the potential of the main bit line MB is reported to the sub bit line SB and voltage of −2 V is applied to the word line WL of the non-selected memory cells sharing the sub bit line SB with the selected memory cells. Thus, incorrect write by disturb is inhibited. In FIG. 13C, the cell indicated by a reference symbol MCw is the cells as objects of write.

During a post-erase, as shown in FIG. 13B, 4 V is applied to the word line WL of the selected memory cell, i.e., to the control gate, and 6 V is applied to the bit line, i.e., to the drain while grinding potential is applied to the common source line SL and to the well. In FIG. 13B, the cell indicated by a reference symbol MCp is the cell as objects of the post-erase. In this post-erase, as has been explained in the third embodiment, a further preferable result can be obtained by changing the voltage pulse width and the word line level according to the number of times of repetition. Moreover, in hot electron injection in write and post-erase, it is possible to employ the voltage application method as back bias to the memory cells.

As is clear when compared to FIG. 13C, the bias relationship during erase of FIG. 13B is identical to that of write. The voltage value for post-erase is smaller than that of write. Thus, the selected memory cell is in a weak write state and accordingly, hot electrons are injected to its floating gate, thereby slightly increasing the threshold voltage. Here, a high voltage of 11 V is applied to the MOSFET Z-SW gate between the sub bit line SB and the main bit line MB connected to the selected memory cells and the gate becomes ON state and the potential of the main bit line MB is reported to the sub bit line SB and voltage of −2 V is applied to the word line WL of the non-selected memory cells sharing the sub bit line SB with the selected memory cells. Thus, incorrect write by disturb is inhibited.

It should be noted that during a data read, all the bit lines MB are pre-charged to the potential Vpc such as 1.0 V, after which a word line WL corresponding to an address supplied is selected and voltage 3V, for example, is applied. Moreover, grinding potential (0 V) is applied to the sources of the memory cells via the common source line SL. Thus, in the memory cells connected to the selected word line WL, following occurs depending on the threshold voltage. That is, if the threshold voltage is low, an electric current flows to lower the potential of the bit line MB and if the threshold voltage is high, no current flow and accordingly, the bit line MB potential is kept at the pre-charge level. This potential is amplified and detected by the sense amplifier 18.

Figure 15:
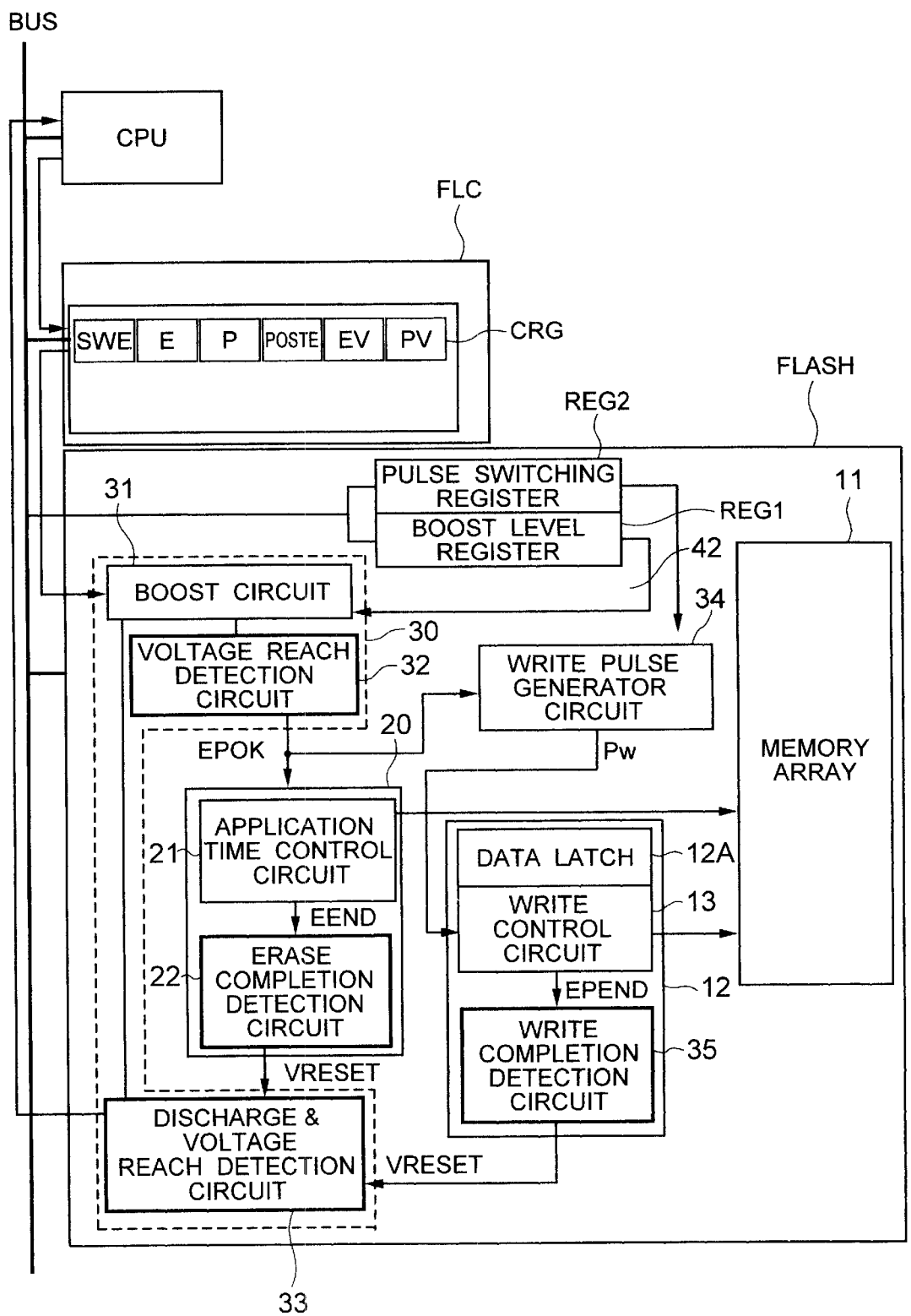
FIG. 15 is a block diagram showing a detailed configuration of the flash memory in an example of a microcomputer having a built-in flash according to the present invention.

FIG. 15 shows a specific example of the control register CRG in the flash control section FLC and a specific example of the flash memory section FLASH of the example of FIG. 12.

As shown in FIG. 15, the control register CRG in the flash control section FLC includes: a rewrite allow bit SWE for indicating to enter a rewrite mode; an erase mode setting bit E for indicating the erase time; a write mode setting bit P for indicating a write time; a post-erase mode setting bit POSTE for indicating a post-erase time; an erase verify mode setting bit EV for indicating an erase verify time; and a write verify mode setting bit PV for indicating a write verify time. The aforementioned respective bits of the control register CRG are constituted so as to be set and reset by the CPU via the bus BUS.

In the flash memory section FLASH according to the present embodiment, when rewriting data, the memory cell is erased and then write is performed, and further a verify read is performed. Accordingly, the aforementioned rewrite allow bit SWE proclaims to enter the rewrite mode and the circuits in the flash memory section FLASH are set to a preparatory state of write/erase and then the erase, write, verify start command are issued. Thus, transfer to the next operation is smoothly performed.

The power source circuit 30 of the flash memory section FLASH includes: a boost circuit 31 such as a charge pump; voltage reach detection circuit 32 for detecting whether the boost voltage has reached a target voltage in the boost circuit 31; and a discharge & voltage reach detection circuit 33 for detecting whether the voltage after the boost is decreased to a predetermined voltage or below. The boost circuit 31 automatically starts boost when the write mode setting bit P or the erase mode setting bit E of the control register CRG is set.

The control circuit 20 includes: a delay circuit for delaying a detection signal of the voltage reach detection circuit 32 or a counter circuit for counting a clock signal according to the detection signal; an application time control circuit 21 for controlling voltage application time; and an erase completion detection circuit 22 for detecting an erase completion according to a signal from the application time control circuit 21. By a detection signal VRESET of the erase completion detection circuit 22, the discharge voltage reach detection circuit 33 starts discharge of the boost circuit 31 and detects whether discharge is terminated, and report the detection result.

Moreover, a write pulse generation circuit 34 is provided for generating a write pulse and supplying it to the control circuit 13 upon reception of a detection signal from the reach voltage detection circuit 32. Moreover, the write latch control circuit 12 includes a write completion detection circuit 35 for detecting a write completion by the write control circuit 13.

By the detection signal VRESET of the write completion detection circuit 35, the discharge & voltage reach detection circuit 33 starts discharge of the boost circuit 31 and detects whether discharge in the boost circuit 31 is complete. Upon detection of the discharge end, the discharge & voltage reach detection circuit 33 reports to the CPU that write or erase is complete. Furthermore, the flash memory section FLASH in this embodiment includes; a boost level setting register REG1 for setting a boost level specifying code for adjusting the boost level in the boost circuit 31 by specification from the CPU; and a pulse width setting register REG2 for setting a pulse width specification code for adjusting the pulse width of the pulses to be applied to the word line by specification from the CPU.

As has been described above, in this embodiment, the CPU sets or resets the respective bits of the control register CRG of the flash control section FLC and sets the register REF1 and REG2 of the flash memory section FLASH. That is, the CPU need not perform time control accompanying the write and erase operations. Control of the boost circuit 31 upon write and erase, and control of a boost voltage application start, application en d and discharge of the boost circuit are all automatically performed by the control circuit 20 of the flash memory section FLASH and the like. Moreover, the verify voltage switching is also performed by the flash control section VLC or the CPU issuing a command to the power source circuit. It should be noted that setting the register REG1 and REG2 of the flash memory section FLASH may be performed by the flash control section FLC instead of the CPU.

Figure 16:
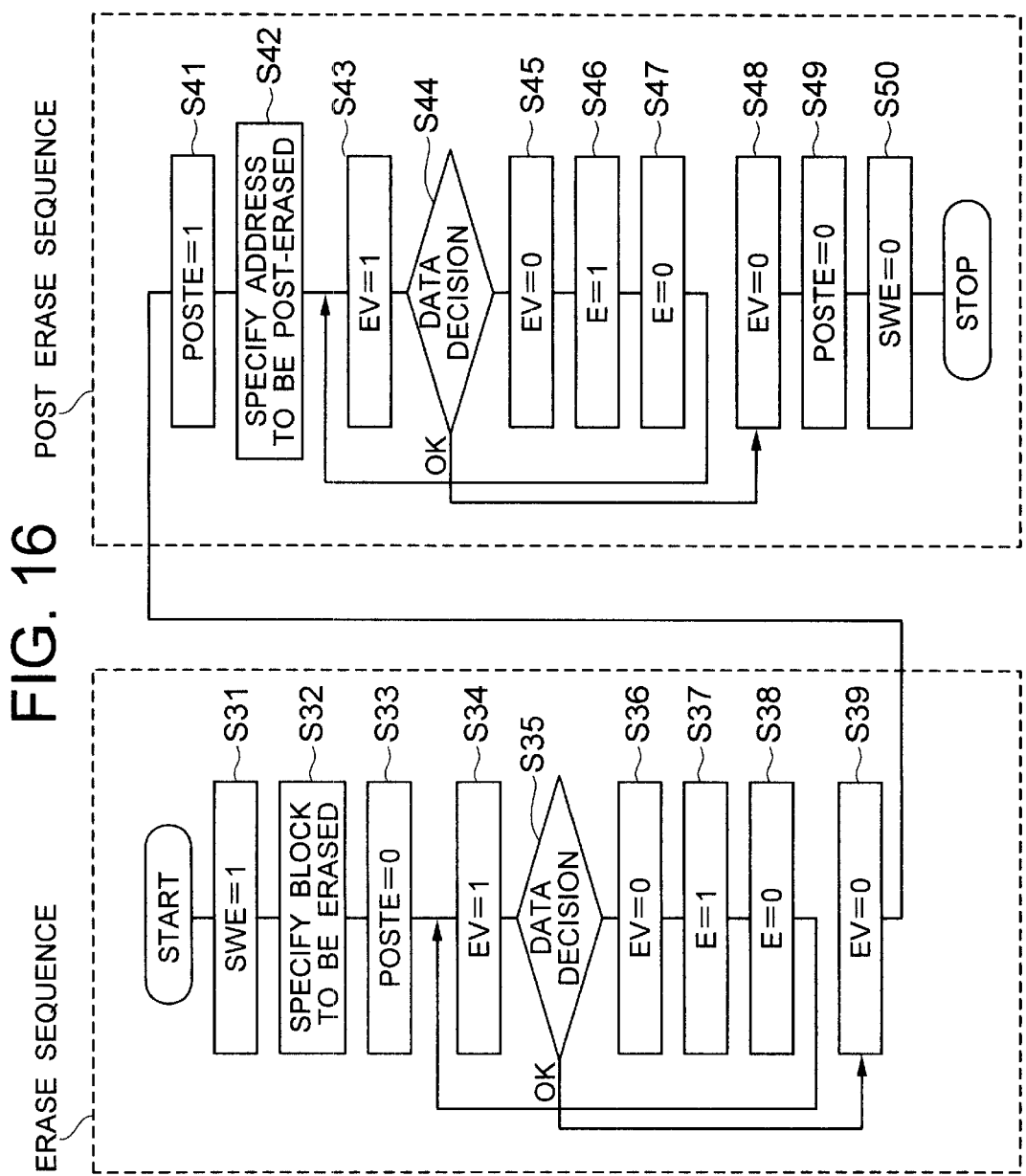
FIG. 16 is a flowchart showing an erase operation in the microcomputer having the built-in flash of the example.

Next, referring to FIG. 16, explanation will be given on an erase operation procedure in the flash memory section according to the embodiment.

When an erase operation is started, firstly, the CPU sets the rewrite allow bit SWE of the control register CRG to "1" (step S31). Next, the CPU supplies via an address bus, an address (Z address) specifying a block to be erased, to the flash memory section, and the address is fetched by the address buffer 17, thereby specifying the block to be erased (step S32). Moreover, the erase block specification may also be performed by setting the erase block register provided in the control register CRG. Then, the CPU resets the post erase mode setting bit POSTE of the control register CRG to "0" (step S33) and sets the erase verify mode setting bit EV to "1" (step S34). Then, in the flash memory section, data of the block specified in step S32 is read from the memory array.

The data which has been read from the flash memory section by the EV bit set to "1" are checked by the CPU to decide whether all are "1", i.e., the erase has been terminated (step S35). Thus, verify is performed first because if an erase is performed without verify, the threshold voltage which is already in an erase state is changed. If step S35 decides that the erase is incomplete, then in the next step S36, the erase verify mode setting bit EV is reset to "0" and in step S37, the erase mode setting bit E is set to "1".

Thus, in the flash memory section, boost is started by the boost circuit 31 and when the voltage reach detection circuit 32 detects that the boost voltage has reached a target voltage, an erase is started. When the erase end detection circuit 22 detects an erase completion, the discharge & voltage reach detection circuit 33 starts discharge of the boost circuit 31.

The CPU sets the erase mode setting bit E to "1" in step S37 and after a predetermined time has passed, the CPU resets the erase mode setting bit E to "0" in step S39. After this, control is passed back to step S34, where the CPU sets the erase verify mode setting bit EV of the control register CRG to "1" and executes the verify read.

In the next step S35, the CPU checks the read data and if it is decided that the erase is complete, control is passed to step S39, where the CPU resets the erase verify mode setting bit EV of the control register CRG, thereby terminating the series of erase processes and control is passed to step S41 where the post-erase operation is started.

In step S41, the CPU sets the post-erase mode setting bit POSTE to "1" and starts a post-erase operation. Next, an address specifying a memory cell (sector) to be subjected to the post-erase is supplied from the CPU via the address bus to the flash memory and fetched to the address buffer 17 to specify the post-erase object (step S42). Then, the CPU sets the erase verify mode setting bit EV of the control register CRG to "1" (step S43). Thus, in the flash memory section, data of the memory cell (sector) specified in step S42 is read from the memory array.

Because the EV bit is set to "1", the data read from the flash memory section is checked by the CPU whether all are "0", i.e., the post-erase is complete (step S44). If the step S44 results in that the erase is incomplete, in the next S45, the erase verify mode setting bit EV is reset to "0" and then in step S46, the erase mode setting bit E is set to "1".

Thus, in the flash memory section, boost by the boost circuit 31 is started. When the voltage reach detection circuit 32 detects that the boost voltage has reached a target voltage, the post-erase is started. When the write completion detection circuit 35 detects that the post-erase is complete, the discharge & voltage reach detection circuit 33 starts discharge of the boost circuit 31.

The CPU sets the erase mode setting bit E to "1" in step S46 and when a predetermined time has passed, the CPU resets the erase mode setting bit E to "0" in step S47. After this, control is passed back to S43, and again the CPU sets the erase verify mode setting bit EV of the control register CRG to "1" for performing the verify read. When the aforementioned EV bit is set to "1", the CPU or the flash control section FLC upon setting of the EV bit to "1" controls the power source circuit 30 in the flash memory section, so as to change the verify voltage in the direction to mitigate the condition.

In the next step S44, the read data is checked. If it is decided that the erase is complete, control is passed to step S48, where the erase verify mode setting bit EV of the control register CRG is reset to "0" and in the next step S49, the post-erase mode setting bit POSTE is set to "1". Furthermore, in step S50, the rewrite allow bit SWE is reset to "0" and the erase operation is complete.

Figure 17:
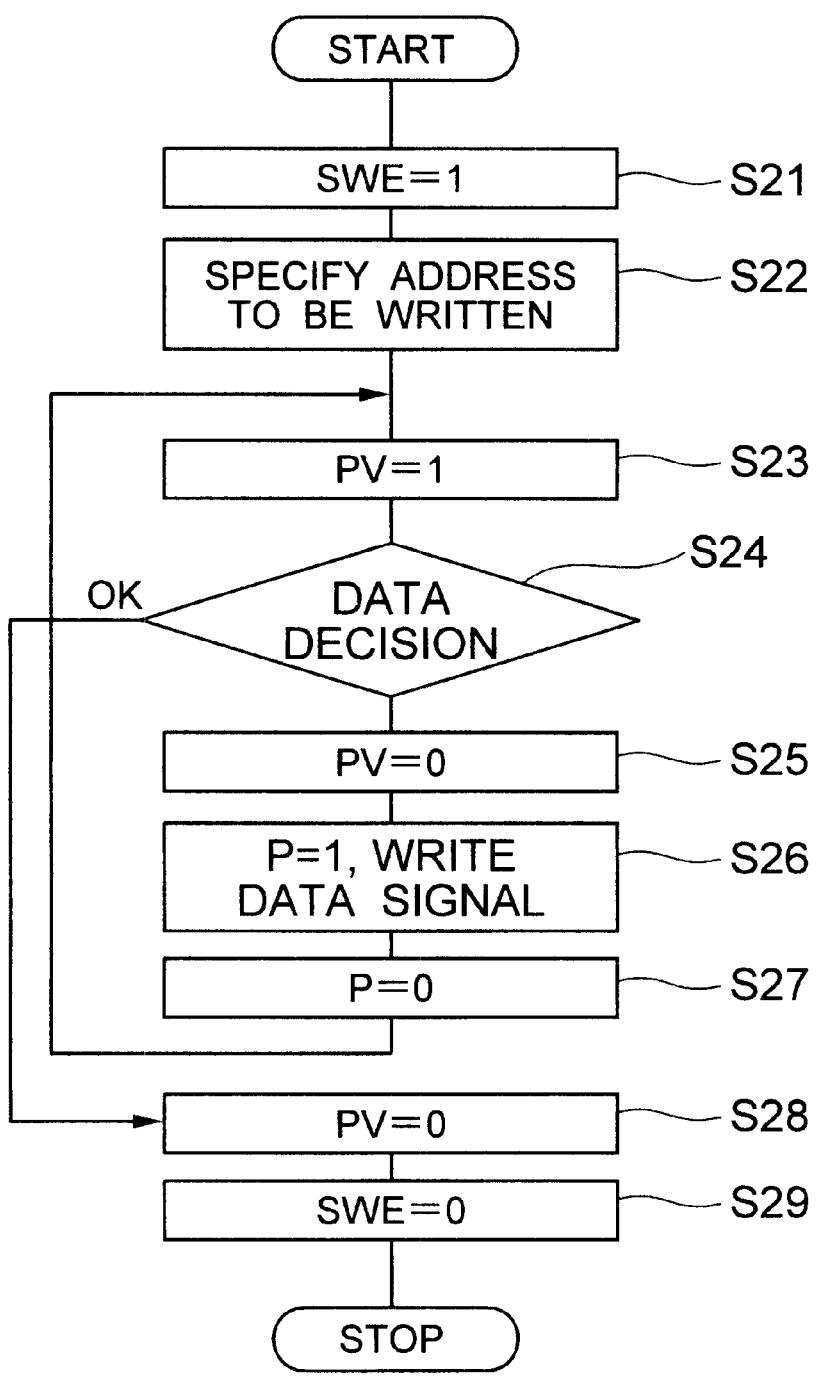
FIG. 17 is a flowchart showing write operation in the microcomputer having the built-in flash of the example.

Next, referring to FIG. 17, explanation will be given on a write procedure in the flash memory section FLASH.

When a write operation is started, firstly, the CPU sets the rewrite allow bit SWE of the control register CRG to "1" (step S21). Next, a write address (X address) is supplied from the CPU via the address bus to the flash memory section and fetched by the address buffer 17, so that the write address is specified (step S22). Next, the CPU sets the write verify mode setting bit PV of the control register CRG to "1" (step S23). Thus, in the flash memory section, data of the address specified in step S22 is read from the memory array.

The read data is compared to the write data by the CPU and check is made whether write is complete (step S24). This verify is performed because if write is performed without performing verify, the threshold voltage of the memory cell already in write state is changed. If step S24 decides that the write is complete, then in the next step S25, the write verify mode setting bit PV is reset to "0" and the write mode setting bit P is set to "1". Write data of the write word line is supplied from the CPU via the data bus to the flash memory section and set (loaded) in the data latch 12A (step S26).

Thus, in the flash memory section, the boost circuit 31 starts boost, and write is started when the voltage reach detection circuit 32 detects that the boost voltage has reached a target voltage. And when the write completion detection circuit 35 detects the write completion, the discharge & voltage reach detection circuit 33 starts discharge of the boost circuit 33.

In step S26, the CPU sets a write data. After a predetermined time has passed, the CPU resets the write mode setting bit P of the control register CRG to "0" (step S27). Then, control is passed to step S23, where the CPU again sets the write verify mode setting bit PV to "1" and executes verify read. Here, it is possible for the CPU or the flash control section FLC to control the power source circuit 30 in the flash memory section, so that the verify voltage is changed so as to mitigate the condition.

Next, step S24 checks the read data and if it is determined that the write is complete, control is passed to step S28, where the write verify mode setting bit PV of the control register CRG is reset to "0". Furthermore, in step S29, the rewrite allow bit SWE is reset to "0", thereby terminating a series of write processes.

Next, referring to FIG. 18, explanation will be given on a specific example of a circuit which changes the word line level during verify and changes the word line voltage level during post-erase described in the aforementioned third embodiment. It should be noted that this circuit is provided in the power source circuit 30 shown in the example of FIG. 15.

Figure 18:
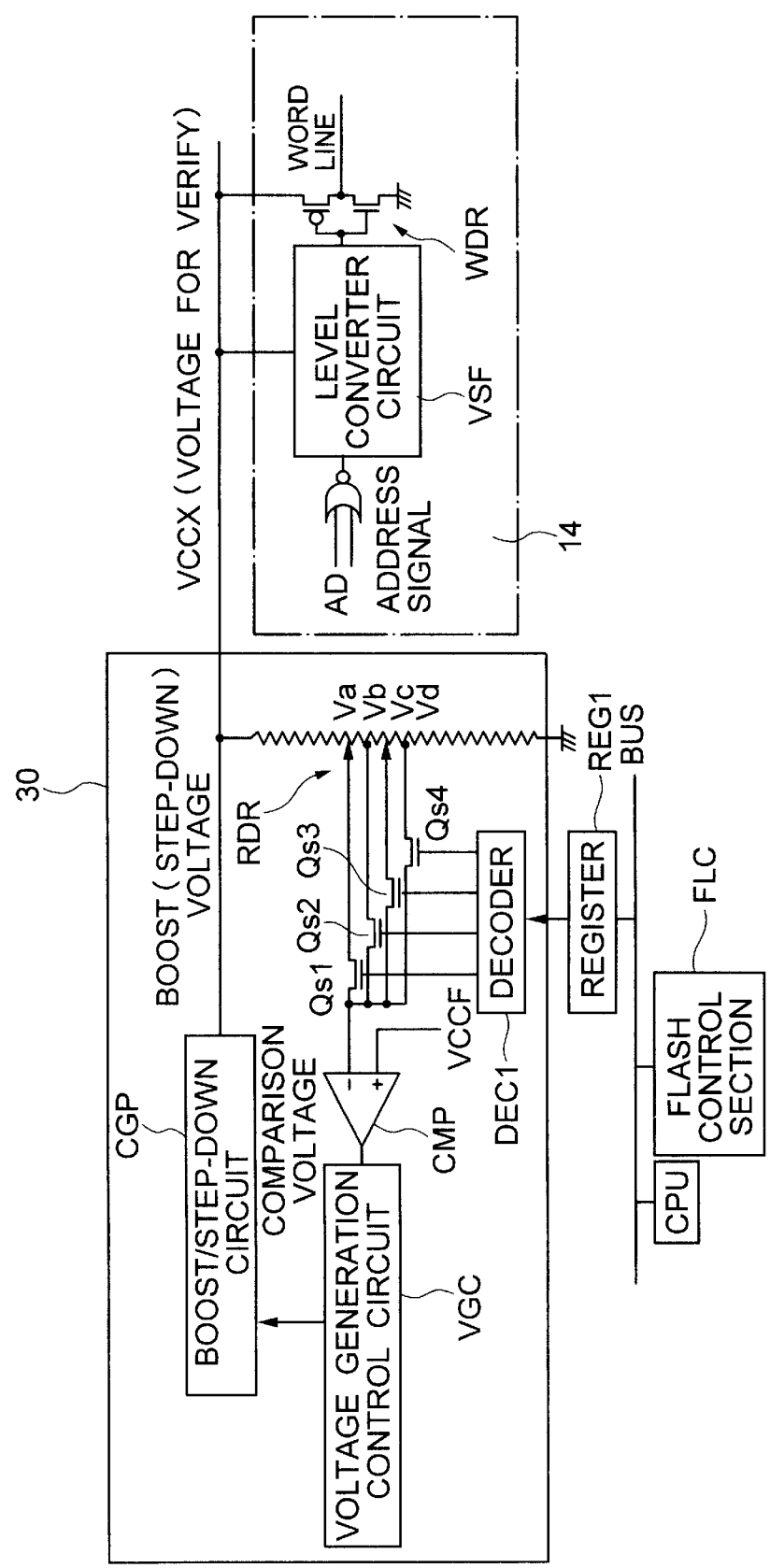
FIG. 18 is a circuit diagram showing a specific configuration example of a power source circuit in the flash memory section of the example.

In FIG. 18, CGP represents a charge pump circuit generating a positive boost voltage. This charge pump circuit CGP may be a known charge pump for successively transferring charge by striking the capacity width clock.

The circuit of FIG. 18 includes: a ladder resistor RDR connected between the output terminal of the charge pump CGP and the grinding potential; switches MOSFET Qs1, Qs2, Qs3, Qs4, . . . for selecting to pass one of the voltages Va, Vb, Vc, Vd, . . . divided by the ladder resistor RDR; a reach detecting comparison circuit CMP for comparing a selected voltage with a reference voltage VCCF so as to decide whether a boost voltage has reached a predetermined level; a voltage generation control circuit VGC for generating a signal to control the charge pump CGP according to an output of the comparison circuit CMP; a register REG1 for setting a code to specify to conduct one of the aforementioned selection switches MOSFET Qs1, Qs2, Qs3, Qs4 . . . ; a decoder DEC1 for generating a signal to decode the set code of the register REG1 and to control on/off of the switches MOSFET Qs1, Qs2, Qs3, As4, . . .

It should be noted that the aforementioned register REG1 is constituted in such a manner that the CPU or the flash control section FLC sets a control code via the bus BUS. The voltage increased by the charge pump CGP is supplied as a power source voltage to the level conversion circuit VSF of the X decoder 14 and the power driver WDR and the word line WL is driven to a desired voltage level.

Figure 19:
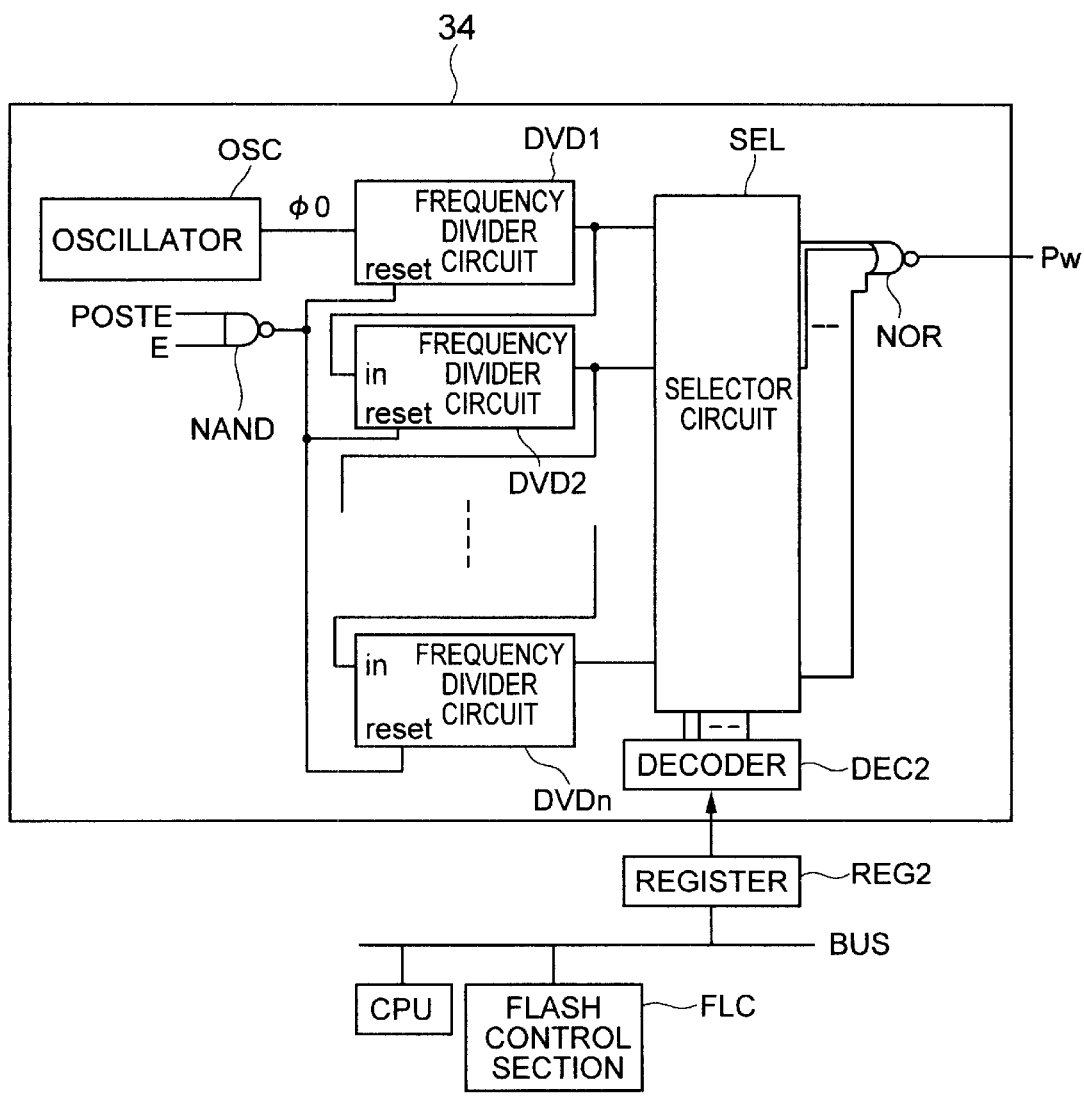
FIG. 19 is a circuit diagram showing a specific configuration example of a write pulse generation circuit in the flash memory section of the example.

Next, referring to FIG. 19, explanation will be given on a specific example of the write pulse generation circuit 34 which changes the width of pulse applied to the word line according to the number of times of repetition.

The write pulse generation circuit 34 of this example includes: a frequency divider circuit DVD1 for dividing the oscillation signal $\phi 0$ of the oscillation circuit OSC into two for example; a multi-stage frequency divider circuit DVD 2 . . . DVDn for dividing the output from the frequency divider circuit DVD1; a selector circuit SEL for selecting and transferring an output of the frequency divider circuit of each stage; a register REG2 for setting a control code for deciding the divided output to be selected by the selector circuit SEL; a decoder DEC2 for decoding the set code of the register REG2 and generating a selection control signal of the selector SEL; a multi-input NOR gate circuit NOR for obtaining a disjunction (OR) between the outputs of the selector circuit SEL; and a NAND gate NAND for generating a signal to perform division by releasing the reset of the frequency divider circuits DVD1 to DVDn according to the erase mode setting bit POSTE and the erase mode setting bit E. The Register REG2 is constituted in such a manner that the CPU or the flash control section FLC sets a control code via the bus BUS.

When the decoder DEC2 supplies to the selector SEL a signal for selecting an output of the frequency divider circuit DVD1, the NOR gate NOR outputs a write pulse Pw having a pulse width twice larger than the oscillation signal $\phi 0$. Moreover, when the decoder DEC2 supplies to the selector SEL a signal to select output of the frequency divider circuit DVD2, the NOR gate NOR outputs a write pulse Pw having a pulse width four times greater than the oscillation signal $\phi 0$. Furthermore, when the decoder DEC2 supplies to the selector SEL a signal to select output of the frequency divider circuit DVDn, the NOR gate NOR outputs a write pulse Pw having a pulse width of oscillation signal $\phi 0$ multiplied by 2n. Accordingly, before starting a post-erase (weak write), a control code specifying a desired pulse width is set in the register REG2 and "1" is set successively in the erase mode setting bit POSTE of the control register in the flash control section and the erase mode setting bit E, thereby enabling post erase with a pulse width changing according to the number of times of repetition.

Next, referring to FIG. 20, explanation will be given on a specific example of the write latch control circuit 12 and the write completion detection circuit 35. It should be noted that the flash memory section in this example is constituted in such a manner that a bit corresponding to data "1" is skipped, and a write pulse is successively applied only to a bit line corresponding to data "0".

Figure 20:
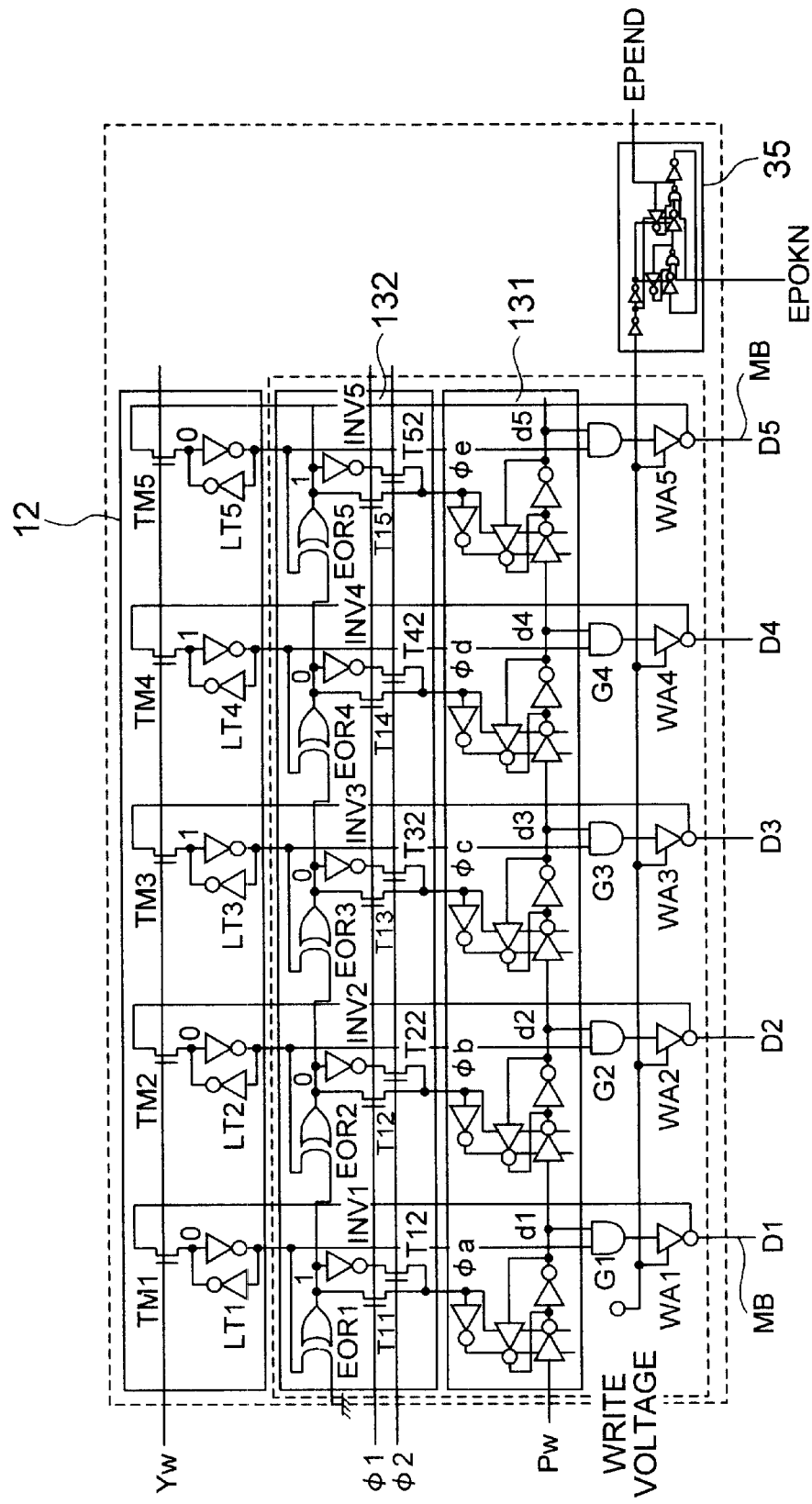
FIG. 20 is a circuit diagram showing a specific example of a write control circuit and a write completion detection circuit of the example.

As shown in FIG. 20, the data latch 12A includes: transfer MOSFET TM1, TM2, TM3, . . . for fetching via the bit line MB each bit of write data which has been input from the bus; and latch circuits LT1, LT2, LT3, . . . having a pair of inverters whose input and output terminals are connected. Moreover, the write control circuit 13 includes: a shift register 131 for controlling write; a data decision & shift control circuit 132 for deciding whether each bit of the write data latched by the data latch 12A is "1" or "0" and controlling shift operation of each stage of the shift register 131 according to the decision result; AND gates G1, G2, G3, . . . supplied with a shift clock from the data decision & shift control circuit 132 and data held in each of the latch circuits LT1, LT2, LT3, . . . of the data latch 12A; and light amplifiers WA1, WA2, WA3, . . . , using a write voltage 10 V as the power source voltage, receiving output of the AND gates G1, G2, G3, . . . , and driving respectively corresponding bit lines MB.

The aforementioned data decision & shift control circuit 132 includes: an EXCLUSIVE-OR gate EORi supplied with as one input, data held in the latch circuits LT1, LT2, LT3, . . . , of the data latch 12A and as the other input, output of a preceding stage; an inverter INVi for reversing the output of the EXCLUSIVE-OR gate; and transfer MOSFET Ti1, Ti2 for alternatively selecting the output of the inverter INVi or the output of the EXCLUSIVE-OR gate EORi according to clock $\phi1$, $\phi2$ and supplying the selected one to respective stages of the shift register 31 as a shift clock.

It should be noted that among the EXCLUSIVE-OR gates EORi of the respective stages, the EXCLUSIVE-OR gate EOR1 of the first stage has an input terminal to which the grinding potential is applied instead of being supplied with an output of an EXCLUSIVE-OR gate EOR (i–1) of a preceding stage. Thus, the EXCLUSIVE-OR gate EOR1 of the first stage outputs a signal "1" when the data held in the latch circuit LT1 of the data latch 12A is "0", and outputs a signal "0" when the data in the latch circuit LT1 is "1". Moreover, the second and subsequent EXCLUSIVE-OR gates EORI reverse the output of the EXCLUSIVE-OR gate EOR(i–1) of a preceding stage when outputting it if the data held in the corresponding latch circuit LTi is "0" and output the output of the EXCLUSIVE-OR gate EOR (i–1) of a preceding stage as it is if the data held in the latch circuit LT1 is "1".

Figure 21:
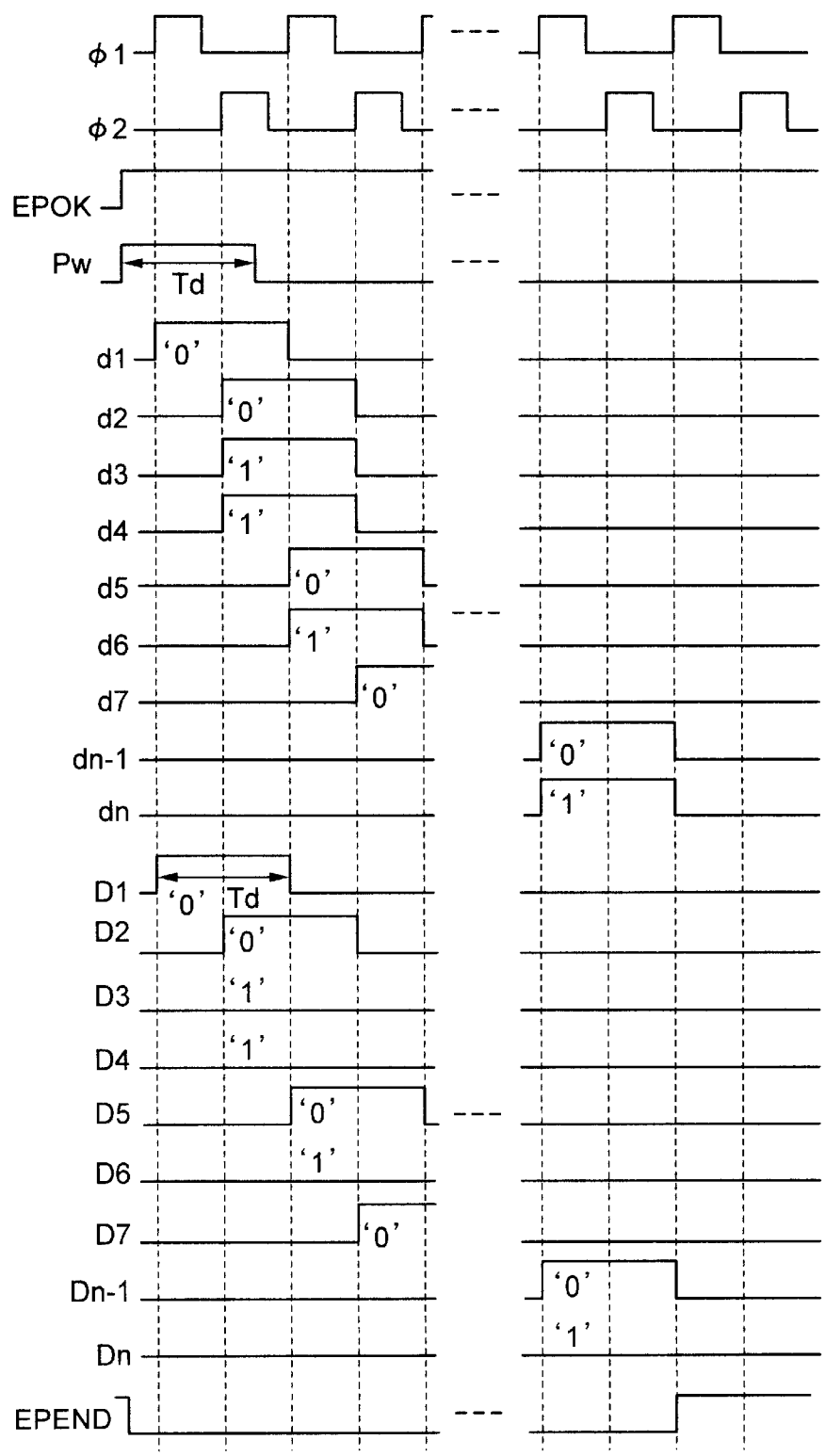
FIG. 21 is a timing chart showing timings of respective signals in the write control circuit of FIG. 20.

As shown in FIG. 21, clock $\phi1$ and $\phi2$ controlling the clock transfer MOSFET Ti1 and Ti2 are arranged in such a manner that their high levels are not overlapped and their phases are shifted by 180 degrees from one another. Thus, each stage of the write control shift register 131 is supplied with a clock (for example, $\phi a$, $\phi e$ in FIG. 20) which is changed to high level in synchronization with rise of the clock $\phi1$ and is changed to low level in synchronization with rise of $\phi2$ when output of the corresponding EXCLUSIVE-OR gate EORi is high level. When the output of the corresponding EXCLUSIVE-OR gate EORi is at low level, clocks supplied (for example, $\phi b$, $\phi c$, $\phi d$) are changed to high level in synchronization with rise of clock $\phi2$ and to low level in synchronization with rise of $\phi1$.

Moreover, as shown in FIG. 21, the first stage of the write control shift register 131 is supplied with a master write pulse Pw having a pulse width Td corresponding to almost one cycle of the clock $\phi1$ for example and is operated in such a manner that the write pulse Pw is successively transferred from a preceding to subsequent stage by the clock $\phi a$, $\phi b$, $\phi c$, $\phi d$, $\phi e$ . . . . Moreover, when clocks changing at the same timing (for example, $\phi b$, $\phi c$, $\phi d$) are continuous, lacing is caused between the stages of the write control shift register 131 and an input pulse of the first stage is latched in all the subsequent stages. In FIG. 21, waveforms of symbols d1 to dn are output of the respective stages of the write control shift register 131 and the waveforms of symbols D1 to Dn are write pulses applied to the bit line MB. It should be noted that the write pulses applied to the bit line MB are applied to the sub bit line SB via the selection switch MOSFET Z-SW.

Like the waveforms d1 to dn shown in FIG. 21, at a "0" bit among the write data, the transfer write pulse is delayed by half cycle of clock $\phi1$ ($\phi2$) while at a "1" bit among the write data, the transfer write pulse is transferred without being delayed. As a result, like the waveforms D1 to Dn in FIG. 20, the write pulses applied to the bit line become pulses successively shifted by half cycle of the clock $\phi1$ ($\phi2$).

As has been described above, when a write pulse is applied only to the bit line corresponding to data "0" while skipping the bits corresponding to data "1", the total write time becomes shorter by the number of bits of data "1" as compared to the conventional method in which the bits corresponding to data "1" are not skipped. Moreover, the write current total Iw is also reduced as compared to the conventional method. As a result, a load to the boost circuit becomes uniform and stable write can be performed with less fluctuation of the boost voltage. When a large write current fluctuation is present, the boost circuit should be designed to cope with that, but when the write current fluctuation is small, the boost circuit design becomes simpler.

The write completion detection circuit 35 shown in FIG. 20 is constituted by a latch circuit supplied with a write pulse which has reached the last stage of the write control shift register 131 and a rewrite enable signal EPOK supplied from the voltage reach detection circuit 32. When the rewrite enable signal EPOK becomes high level, the write completion detection circuit 35 changes its output to low level, and when a write pulse has reached the last stage of the write control shift register 131, this functions as a trigger signal and the write enable signal EPOK is latched, and the output is reversed, thereby changing the output to high level. Thus, the write completion detection signal 35 outputs a write completion detection signal EPEND which is at low level during a period between the write start and end.

Next, referring to FIG. 22, explanation will be given on a specific example of the sense amplifier circuit whose discrimination level is variable in such a manner that the decision condition is gradually mitigated, as the one used in the aforementioned fourth embodiment. It should be noted that when this circuit is applied, it is applied as the sense amplifier 18 shown in the example of FIG. 12. In the figure, the gate terminals of a symbol representing MOSFET indicated by ○ are p-channel MOSFET and those without this circle are n-channel MOSFET.

Figure 22:
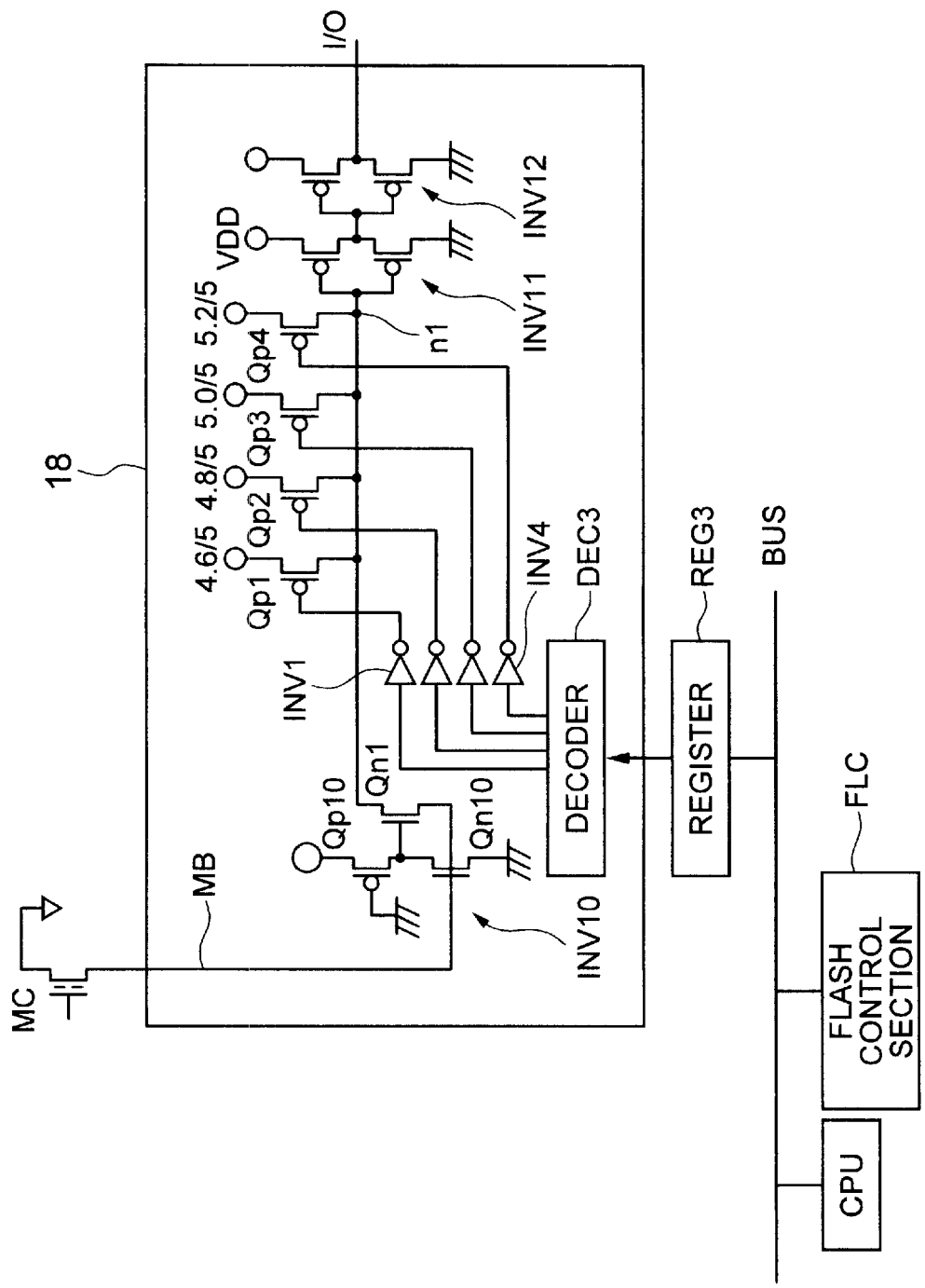
FIG. 22 is a circuit diagram showing a specific configuration example of a sense amplifier circuit in the flash memory according to a fourth embodiment.

The sense amplifier circuit of FIG. 22 includes: load MOSFET Qp1, Qp2, Qp3, and Qp4 connected in parallel between the drain terminal (node n1) of the MOSFET Qn1 whose source terminal is connected to the main bit line MB and the power source voltage VDD; a register REG3 for setting a control code which makes one of these to ON state; a decoder DEC3 for decoding the code set by the register REG3 and generating a signal to control ON/OFF state of the load MOSFET Qp1, Qp2, Qp3, and Qp4; inverters INV1 to INV4 for reversing an output signal from the decoder DEC3 and applying the reversed signal to the load MOSFET Qp1, Qp2, Qp3, and Qp4; two-stage CMOS inverters INV11 and INV12 for detecting and outputting a drain voltage of the MOSFET Qn1; inverter INV10 controlling the MOSFET Qn1 according to the potential of the main bit line MB; and the like.

The inverter 10 includes: an n-channel MOSFET Qn10 whose source terminal is a grinding point and whose gate terminal receives potential of the main bit line MB; and a p-channel MOSFET Qp10 which is connected between the drain terminal of the MOSFE Qn10 and the power source voltage terminal VDD and whose gate terminal receives the grinding potential, so that the p-channel MOSFET Qp10 is always in ON state. The n-channel MOSFET Qn10 of this inverter INV10 turns ON and the MOSFET Qn1 is turned OFF when the main bit line MB is pre-charged, and the potential of the node n1 is fixed to VDD. That is, the sense amplifier does not operate.

When the word line rises and a memory cell read operation is performed, a memory cell having a low threshold voltage is turned ON and current flows to the main bit line BL to which this memory cell is connected. Then, the potential of the main bit line is lowered and the MOSFET Qn10 is turned OFF and An1 is turned ON, thereby flowing current to the main bit line BL via one of the load MOSFET Qpq, Qp2, Qp3, and Qp4. This changes the potential of the node n1. When the potential of this node n1 becomes lower than the theoretical threshold voltage of the CMOS inverter INV11, the sense amplifier circuit 18 changes its output. Thus, data of the selected memory is read.

In the sense amplifier circuit of this example, the W/L ratio(ratio of gate width W against gate length L) of the MOSFET Qp1, Qp2, Qp3, and Qp4 are set, for example, to 4.6/5, 4.8/5, 5.0/5, and 5.2/5, respectively, so as to have different ON resistance values. For this, when the load MOSFET Qp1, Qp2, Qp3, and Qp4 which are turned ON by the code set in the decoder DEC3 are switched from one to another, the resistance value is also changed. As a result, when current flows from one of the load MOSFET Qp1, Qp2, Qp3, and Qp4 toward the main bit line BL, the potential of the node n1 varies depending on the ON-state MOSFET Qp1, Qp2, Qp3, and Qp4. That is, according to the code set in the decoder DEC2, the discrimination level of the sense amplifier 18 is switched from one to another. The aforementioned register REG3 is constituted in such a manner that the CPU or the flash control section FLC sets a control code via the bus BUS.

It should be noted that in the example of FIG. 22, like Qp1 to Qp4, a plurality of load MOSFET are provided in parallel on the current flow path toward the main bit line BL during read and MOSFET to be turned ON is changed by a register value so as to switch the discrimination level of the sense amplifier circuit. However, it is also possible that the CMOS inverter INV11 connected to the node n1 to which sense current flows has a variable theoretical threshold voltage and the value is selected by the code set in the decoder DEC3, thereby switching the discrimination level of the sense amplifier from one to another.

Figure 23:
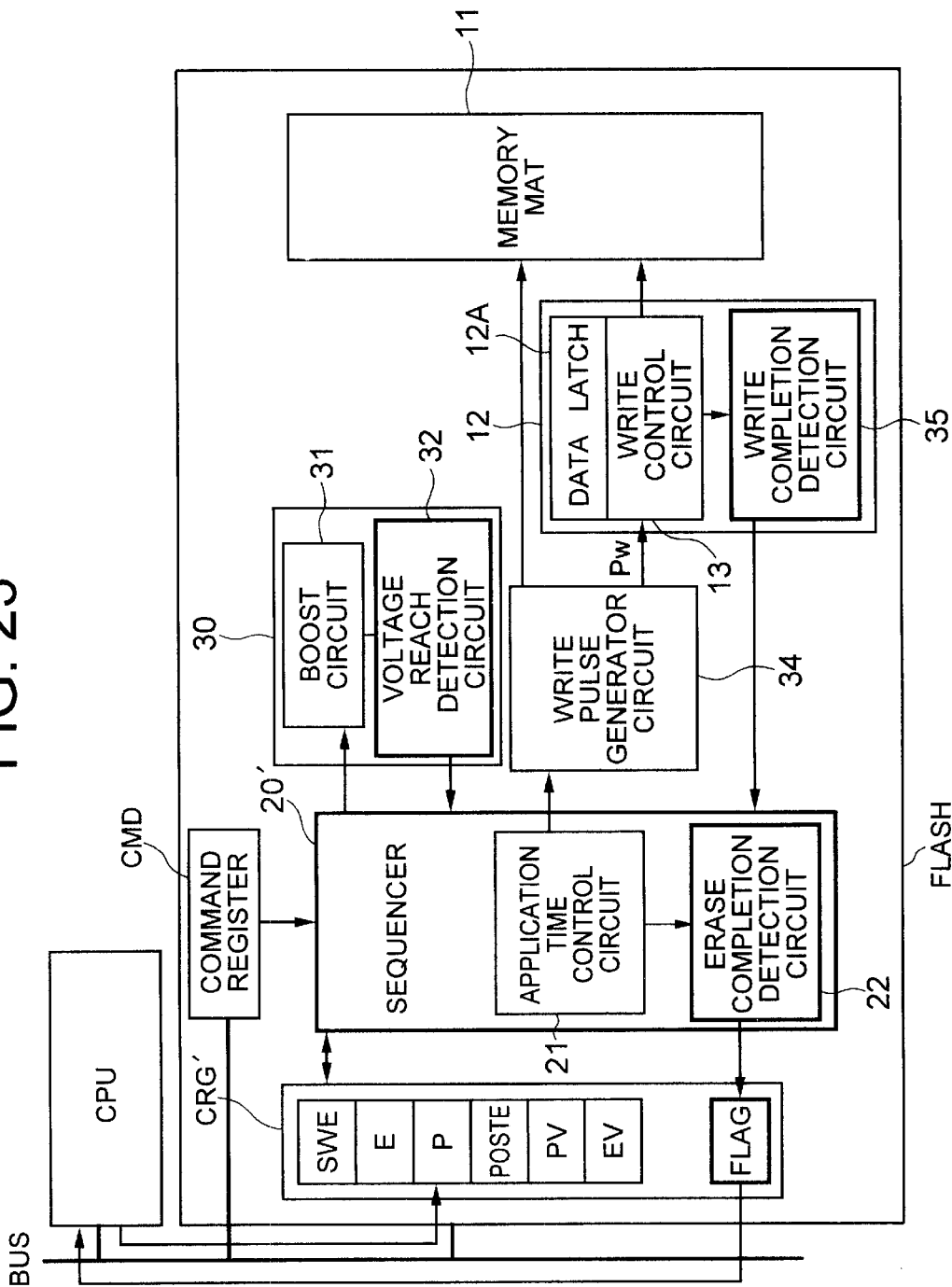
FIG. 23 is a block diagram showing an example of the flash memory chip according to the present invention.
Figure 24:
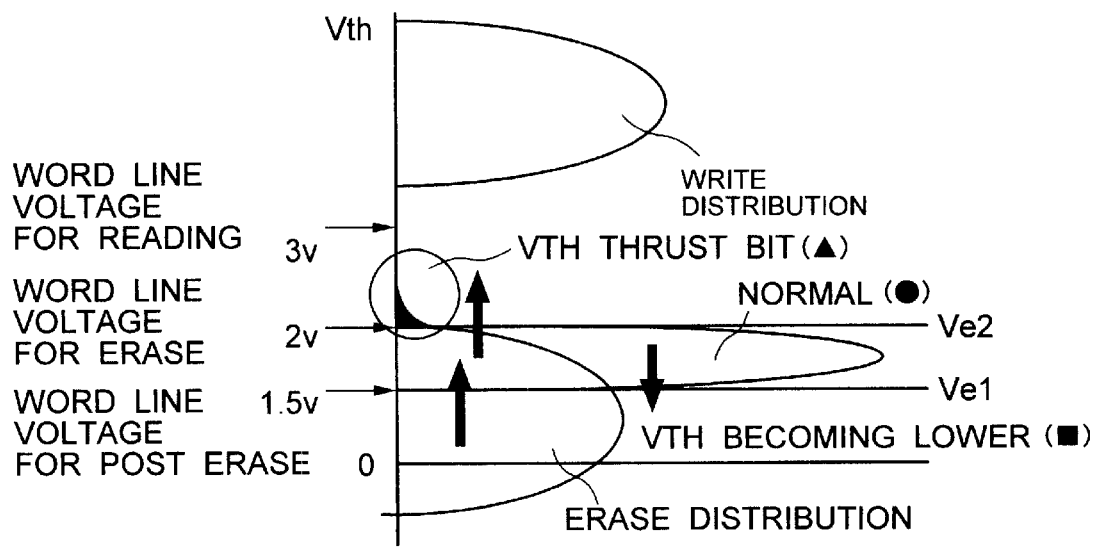
FIG. 24 shows a threshold voltage distribution for explaining a thrust phenomenon in the post erase.
Figure 25:
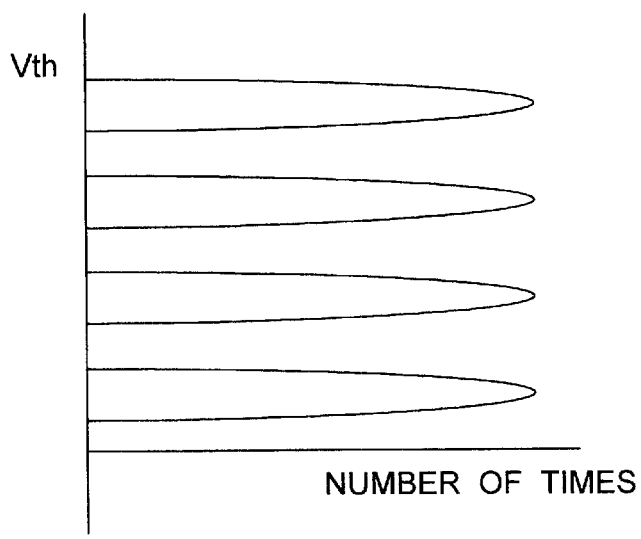
FIG. 25 shows a threshold voltage distribution when 2-bit data is stored in an storage element as an example of a multi-value flash memory.

FIG. 23 shows another example to which the present invention can advantageously be applied. In this example, the present invention is applied to a so-called flash memory chip which is formed as a semiconductor integrated circuit on a semiconductor substrate which is separate from the CPU. The flash memory chip shown in FIG. 23 has a configuration similar to the flash memory section of the aforementioned example (FIG. 15) which is built in a microcomputer chip. In FIG. 23, circuit blocks having functions identical to or similar to the circuit blocks shown in FIG. 15 are denoted by like reference symbols and overlapped explanations are omitted.

The example of FIG. 23 greatly differs from the example of FIG. 15 in that while in the example of FIG. 15, the CPU sets the respective bits of the control register CRG, so as to indicate operation of the flash memory, in the example of FIG. 23, the flash memory chip has a built-in command register CMD and sequencer (control circuit) 20' and when an external CPU sets a command, the sequencer 20' interprets the command, thereby controlling the operation of the flash memory.

Moreover, the example of FIG. 23 includes a control register CRG' similar to the control register CRG' provided in the flash control section FLC of the example of FIG. 15. This control register CRG cannot be set or reset by an external CPU and is set and reset by the aforementioned sequencer 20'. Furthermore, in this example, the control register CRG' has an end flag FLAG for reporting outside upon completion of write, erase, read or the like. The remaining configuration is almost identical to that of the example of FIG. 15. It should be noted that the voltage reach detection circuit 32 in FIG. 23 includes the discharge & voltage reach detection circuit 33.

Moreover, FIG. 23 is simplified so as to correspond to FIG. 15. Actually, like the flash memory section FLASH shown in FIG. 12, peripheral circuits such as the address decoder and the sense amplifier are provided. The command register CMD is not limited to a particular one. In this example, the command register CMD is configured in such a manner that a command code indicating write, erase, and the like can be set by the CPU via an external data bus. When a command code is set in this command register CMD, the sequencer 20' interprets the command and starts a corresponding control operation.

Like the control register in the example of FIG. 15, the control register CRG' includes: a rewrite allow bit SWE proclaiming to enter a rewrite mode; an erase mode setting bit E for specifying an erase time; a write mode setting bit P specifying a write time; a post erase mode setting bit POSTE specifying a post erase time; an erase verify mode setting bit EV specifying an erase verify time; a write verify mode setting bit PV indicating a write verify time; and an end flag FLAG indicating completion of write or erase.

In this example, bits excluding the end flag FLAG of the control register CRG cannot be set or reset by the CPU. The end flag FLAG can be reset by the CPU via the data bus DBS and read can also be performed. However, it is also possible to provide a terminal to report the state of the erase end flag FLAG directly to the CPU.

In the flash memory chip of this example, the sequencer 20' sets and resets the bit of the control register CRG and according to the bit set state, generates an internal control signal to the power source circuit 30, the write pulse generation circuit 34, the address decoder (not depicted), and the like, thereby performing a write, erase, read operation. The sequencer 20', for example, has a ROM (read only memory) containing a series of micro-instructions required for executing a command. The command decoder generates a head address of the micro-instructions corresponding to a command and supplies it to the control circuit 20', so that the micro-instructions are successively executed and control signals are formed corresponding to the respective circuits in the chip.

The write and erase procedures in the flash memory chip by the sequencer 20' when a command code is supplied from the CPU are similar to the write and erase procedure in the microcomputer built in the flash memory chip, and their explanations are here omitted. As described in the embodiment, in the flash memory chip, an operation mode of changing the threshold voltage at the verify operation in the post erase or the like and an operation mode of not changing the same may be selectable. The operation mode may be selected by a command from the CPU, or it may be selected by changing the connection of the terminal connected to the chip by a user of the chip.

The present invention made by the present inventors has been described according to the embodiments, but the present invention is not to be limited to the aforementioned embodiments but may be modified without departing from the spirit of the invention. For example, the-embodiments have been explained through a so-called DiNOR type flash memory, i.e., a case where a plurality of memory cells have drains, each of which is connected to the sub bit line, which in turn is connected to the main bit line via a selector switch. However, the present invention can also be applied to a so-called NOR type flash memory in which a plurality of memory cells are connected in series and the AND type flash memory in which a plurality of memory cells have sources and drains, each of which is connected to a local source line and a local drain line. In such a case also, it is possible to obtain the same effects.

The present invention thus far been explained in a case that the present invention is applied to the flash memory and a microcomputer having the built-in flash memory. However, the present invention is not limited to this but can be applied to a non-volatile storage memory such as EEPROM, a microcomputer having the built-in EEPROM, and other semiconductor integrated circuits.

That is, according to the described embodiments of the present invention, the predetermined voltage for checking whether a threshold voltage of a memory cell is contained in a predetermined threshold voltage distribution is changed in three stages or more in a direction to mitigate the decision condition. Accordingly, it is possible to prevent non-convergence of write and erase operation and realize a non-volatile memory that can reduce a total time required for write and a microcomputer having such a memory as a built-in component.

Moreover, in the post write and post erase which are repeatedly performed, the voltage application time to a memory cell is varied from a precedent voltage application time, thereby effectively changing the memory threshold voltage so as to enable write and erase in a short time.

It should be further understood by those skilled in the art that the foregoing description has been made on embodiments of the invention and that various changes and modifications may be made in the invention without departing from the spirit of the invention and the scope of the appended claims.

What is claimed is:

1. A non-volatile storage device comprising a control section and a memory array having a plurality of word lines and a plurality of memory cells connected to the respective word lines, wherein the memory cells have a threshold voltage contained in a first threshold voltage distribution among two or more threshold voltage distributions;

the control section selects a predetermined word line from the plurality of word lines, and performs; a first operation, in which the control section changes the threshold voltage of the plurality of memory cells connected to the selected word line, from the first threshold voltage distribution to a second threshold voltage distribution; and a second operation, in which the control section checks whether the threshold voltage of the respective memory cells is contained in the second threshold voltage distribution;

in the second operation, among the plurality of memory cells, those memory cells whose threshold voltage is not contained in the second threshold voltage distribution are subjected again to the first operation and the second operation;

in the second operation, a predetermined voltage is applied to the respective memory cells, so as to check whether the threshold voltage of the memory cells is contained in the second threshold voltage distribution;

the predetermined voltage is provided in at least three level; and the predetermined voltage applied to memory cells in the second operation performed first is different from the predetermined voltage applied in the second operation performed later.

2. The non-volatile storage device according to claim 1, wherein the first operation is performed by applying a predetermined voltage to a memory cell and the voltage applied to the memory cell in the subsequent first operation is different from the voltage applied to the memory cell in the preceding first operation.

3. The non-volatile storage device according to claim 1, wherein the first operation is performed by applying a predetermined voltage to a memory cell and the time of voltage application to the memory cell in the subsequent first operation is different from the time of voltage application to the memory cell in the preceding first operation.

4. A non-volatile storage device comprising a control section and a memory array having a plurality of word lines and a plurality of memory cells connected to the respective word lines, wherein the memory cells have a threshold voltage contained in a first threshold voltage distribution among two or more threshold voltage distributions;

the control section selects a predetermined word line from the plurality of word lines, and performs; a first operation, in which the control section changes the threshold voltage of the plurality of memory cells connected to the selected word line, from the first threshold voltage distribution to a second threshold voltage distribution; and a second operation, in which the control section checks whether the threshold voltage of the respective memory cells is contained in the second threshold voltage distribution;

in the second operation, among the plurality of memory cells, those memory calls whose threshold voltage is not contained in the second threshold voltage distribution are subjected again to the first operation and the second operation;

in the second operation, a predetermined voltage is applied to the respective memory cells, so as to check whether the threshold voltage of the memory cells is contained in the second threshold voltage distribution;

the predetermined voltage is provided in at least three levels; and in the preceding second operation, the predetermined voltage applied to a memory cell is different from a voltage equivalent to the upper or lower limit of the second threshold voltage distribution.

5. A non-volatile storage device comprising a control section and a memory array having a plurality of word lines and a plurality of memory cells connected to the respective word lines, wherein the memory cells have a threshold voltage contained in a first threshold voltage distribution among two or more threshold voltage distributions;

the control section selects a predetermined word line from the plurality of word lines, and performs: a first operation, in which the control section changes the threshold voltage of the plurality of memory cells connected to the selected word line, from the first threshold voltage distribution to a second threshold voltage distribution which voltage is higher than the first threshold voltage distribution; and a second operation, in which the control section checks whether the threshold voltage of the respective memory cells is contained in the second threshold voltage distribution;

in the second operation, among the plurality of memory cells, those memory cells whose threshold voltage in not contained in the second threshold voltage distribution are subjected again to the first operation and the second operation;

in the second operation, a predetermined voltage is applied to the respective memory cells, so as to check whether the threshold voltage of the memory cells in contained in the second threshold voltage distribution;

the predetermined voltage is provided in at least three levels; and in the preceding second operation, the predetermined voltage applied to a memory cell is higher than a voltage equivalent to the lower limit of the second threshold voltage distribution.

6. A non-volatile storage device comprising a control section and a memory array having a plurality of word lines and a plurality of memory cells connected to the respective word lines, wherein the memory cells have a threshold voltage contained in a first threshold voltage distribution among two or more threshold voltage distributions;

the control section selects a predetermined word line from the plurality of word lines, and performs: a first operation, in which the control section changes the threshold voltage of the plurality of memory cells connected to the selected word line, from the first threshold voltage distribution to a second threshold voltage distribution which voltage is lower than the first threshold voltage distribution; and a second operation, in which the control section checks whether the threshold voltage of the respective memory cells is contained in the second threshold voltage distribution;

in the second operation, among the plurality of memory cells, those memory cells whose threshold voltage is not contained in the second threshold voltage distribution are subjected again to the first operation and the second operation;

in the second operation, a predetermined voltage is applied to the respective memory cells, so as to check whether the threshold voltage of the memory cells is contained in the second threshold voltage distribution;

the predetermined voltage is provided in at least three levels; and in the preceding second operation, the predetermined voltage applied to a memory tell is lower than a voltage equivalent to the upper limit of the second threshold voltage distribution.

7. A non-volatile storage device comprising a control section and a memory array having a plurality of word lines and a plurality of memory cells connected to the respective word lines, wherein the memory cells have a threshold voltage contained in a first threshold voltage distribution among two or more threshold voltage distributions;

when the first threshold voltage distribution is higher than the second threshold voltage distribution, the control section changes the threshold voltage of the memory cells to a voltage lower than the upper limit of the second threshold voltage distribution as a first operation, after this, the control section changes threshold voltage of the memory cells detected, by a second operation, to be lower than the lower limit of the second threshold value distribution, to a threshold voltage higher than the lower limit as a third operation, and the control section checks whether the threshold voltage of the respective memory cells is higher than the lower limit as a fourth operation, which is repeated twice or more, in the fourth operation, a predetermined voltage is applied to the respective memory cells so as to check whether the threshold voltage of the memory cells is higher than the aforementioned lower limit; and the predetermined voltage applied to the memory cells in the fourth operation is higher than a voltage equivalent to the lower limit of the second threshold value distribution.

8. The non-volatile storage device according to claim 7, wherein the first operation is performed by applying a predetermined voltage to a memory cell and the voltage applied to the memory cell in the subsequent first operation is different from the voltage applied to the memory cell in the preceding first operation.

9. The non-volatile storage device according to claim 7, wherein the first operation is performed by applying a predetermined voltage to a memory cell and the time of voltage application to the memory cell in the subsequent first operation is different from the time of voltage application to the memory cell in the preceding first operation.

10. A non-volatile storage device comprising a control section and a memory array having a plurality of word lines and a plurality of memory cells connected to the respective word lines, wherein the memory cells have a threshold voltage contained in a first threshold voltage distribution among two or more threshold voltage distributions;

when the first threshold voltage distribution is lower than the second threshold voltage distribution, the control section changes the threshold voltage of the memory cells to a voltage high than the lower limit of the second threshold voltage distribution as a first operation, after this, the control section changes the threshold voltage of the memory cells detected, by a second operation, to be lower than the upper limit of the second threshold value distribution, to a threshold voltage higher than the lower limit as a third operation, and the control section checks whether the threshold voltage of the respective memory cells is higher than the lower limit as a fourth operation, which is repeated twice or more, in the fourth operation, a predetermined voltage is applied to the respective memory cells so as to check whether the threshold voltage of the memory cells is lower than the aforementioned upper limit; and the predetermined voltage applied to the memory cells in the fourth operation is lower than a voltage equivalent to the upper limit of the second threshold value distribution.

11. A non-volatile storage system comprising a control device and one or more non-volatile storage devices, wherein the control device can set a first operation mode or a second operation mode in the non-volatile storage device(s);

each of the non-volatile storage devices includes a control section and a memory array section;

the memory array section has a plurality of word lines and a plurality of memory cells respectively connected to the word linen;

each of the memory cells has a threshold voltage contained in a first threshold voltage distribution among two or more threshold voltage distributions;

the control section selects a predetermined word line from the plurality of word lines, and performs: a first operation, in which the control section changes the threshold voltage of the plurality of memory cells connected to the selected word line, from the first threshold voltage distribution to a second threshold voltage distribution; and a second operation, in which the control section checks whether the threshold voltage of the respective memory cells is contained in the second threshold voltage distribution;

in the second operation, among the plurality of memory cells, those memory cells whose threshold voltage is got contained in the second threshold voltage distribution are subjected again to the first operation and the second operation;

in the second operation, a predetermined voltage is applied to the respective memory cells, so as to check whether the threshold voltage of the memory cells is contained in the second threshold voltage distribution;

the predetermined voltage is provided in at least three levels; and in the first operation mode, the predetermined voltage applied to a memory cell in the second operation is different frog the predetermined voltage applied to the memory cell in the second operation performed later.

12. A non-volatile storage device comprising a control section and a memory array having a plurality of word lines and a plurality of memory cells connected to the respective word lines, wherein the memory cells have a threshold voltage contained in a first threshold voltage distribution among two or more threshold voltage distributions;

the control section performs: a selection operation for selecting a predetermined word line from the plurality of word lines; a first operation for changing in a first direction the threshold voltage of the plurality of memory cells connected to the selected word line and checking whether all of the threshold voltages of the respective memory cells have been changed in the first direction from a first voltage; and a second operation for changing the threshold voltages of the plurality of memory cells into a range between the first voltage and a second voltage apart from the first voltage in the first direction;

in the second operation, check is made to determine whether the threshold voltages of the plurality of memory cells are all contained in the range between the first and second voltage, and the second operation is repeated until threshold voltages of all the memory cells are found in the range between the first and second voltage;

when performing the check operation, a third voltage is applied to the plurality of memory cells;

the predetermined voltage is provided in at least three levels; and in the check operation of the subsequent second operation, the third voltage applied to the memory cells is different from the third voltage applied to the memory cells in the check operation during the preceding second operation.

13. The non-volatile storage device according to claim 12, wherein in the check operation of the subsequent second operation, the third voltage applied to the memory cells is in the first direction as compared to the third voltage applied to the memory cells in the check operation during the preceding second operation.

14. The non-volatile storage device according to claim 13, wherein in the check operation of the preceding second operation, the third voltage applied to the memory cells is nearer to the first voltage than the second voltage.

15. The non-volatile storage device according to claim 12, wherein in the first operation, a check operation in performed to decide whether the threshold voltages of all the memory cells have been changed into the first direction as compared to the first voltages and the first operation is repeated until the threshold voltage of all the memory cells is changed in the first direction as compared to the first voltage;

in the check operation of the first operation, a fourth voltage is applied to the memory cells;

the fourth voltage is provided at least in three levels; and in check operation of the preceding first operation, the fourth voltage applied to the memory cells is different from the fourth voltage applied to memory cells in the first operation performed later.

16. The non-volatile storage device according to claim 15, wherein the fourth voltage applied to the memory cells in the check operation during the preceding first operation is in the first direction as compared to the fourth voltage applied to the memory cells in the check operation during the subsequent first operation performed later.

17. The non-volatile storage device according to claim 16, wherein the fourth voltage applied to the memory cells in the check operation during the preceding first operation is nearer to the second voltage than the first voltage.

18. The non-volatile storage device according to claim 12, wherein the two or more threshold voltage distributions include a first threshold voltage distribution which is nearest to the first direction; and prior to the first operation, some of the memory cells may have a threshold voltage found in the first threshold voltage distribution range.

19. The non-volatile storage device according to claim 12, wherein the upper limit voltage or the lower limit voltage of the first threshold voltage distribution range is the first voltage and the other of the upper or the lower limit voltage is the second voltage.

* * * * *